United States Patent
Kato

(10) Patent No.: US 10,153,131 B2
(45) Date of Patent: Dec. 11, 2018

(54) PLASMA PROCESSING APPARATUS AND PLASMA PROCESSING METHOD

(71) Applicant: TOKYO ELECTRON LIMITED, Tokyo (JP)

(72) Inventor: Hitoshi Kato, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 9 days.

(21) Appl. No.: 15/469,910

(22) Filed: Mar. 27, 2017

(65) Prior Publication Data

US 2017/0287677 A1 Oct. 5, 2017

(30) Foreign Application Priority Data

Mar. 29, 2016 (JP) .................................. 2016-065238

(51) Int. Cl.
*H01J 37/32* (2006.01)

(52) U.S. Cl.
CPC ....... *H01J 37/3211* (2013.01); *H01J 37/3244* (2013.01); *H01J 37/32366* (2013.01); *H01J 37/32394* (2013.01); *H01J 37/32715* (2013.01); *H01J 2237/327* (2013.01)

(58) Field of Classification Search
None
See application file for complete search history.

(56) References Cited

U.S. PATENT DOCUMENTS

| | | | | |
|---|---|---|---|---|
| 4,832,361 A | * | 5/1989 | Nakao | ....................... B62B 7/08 |
| | | | | 280/47.39 |
| 8,673,395 B2 | * | 3/2014 | Kato | .................. H01L 21/02104 |
| | | | | 427/248.1 |
| 8,853,097 B2 | * | 10/2014 | Kato | .................... H01L 21/0206 |
| | | | | 438/758 |
| 8,853,100 B2 | * | 10/2014 | Igeta | .................... H01L 21/0228 |
| | | | | 118/715 |
| 8,871,654 B2 | * | 10/2014 | Kato | .................. H01L 21/02233 |
| | | | | 438/771 |
| 8,927,440 B2 | * | 1/2015 | Kato | .................... H01L 21/0228 |
| | | | | 118/696 |
| 9,053,909 B2 | * | 6/2015 | Kato | ...................... C23C 16/452 |
| 9,111,747 B2 | * | 8/2015 | Yamawaku | ....... H01L 21/02104 |
| 9,190,248 B2 | * | 11/2015 | Buonodono | ...... H01J 37/32357 |
| 9,466,483 B2 | * | 10/2016 | Kato | ........................ C23C 16/46 |
| 9,502,215 B2 | * | 11/2016 | Kato | ..................... H01J 37/3211 |
| 9,583,312 B2 | * | 2/2017 | Yamawaku | ....... H01L 21/68764 |
| 9,711,370 B2 | * | 7/2017 | Miura | ............... H01L 21/31116 |

(Continued)

FOREIGN PATENT DOCUMENTS

JP 2013-45903 A 3/2013

*Primary Examiner* — Douglas W Owens
*Assistant Examiner* — Srinivas Sathiraju
(74) *Attorney, Agent, or Firm* — Nath, Goldberg & Meyer; Jerald L. Meyer

(57) ABSTRACT

A plasma processing apparatus includes a processing chamber, a rotation table installed in the processing chamber and configured to load a substrate on an upper surface of the rotation table along a circumferential direction of the rotation table, and a plasma generator including an antenna located above an upper surface of the processing chamber and installed to be able to move in a radial direction of the rotation table, wherein the plasma generator is configured to locally apply plasma to the rotation table in the radial direction.

17 Claims, 14 Drawing Sheets

(56) References Cited

U.S. PATENT DOCUMENTS

| | | | | |
|---|---|---|---|---|
| 9,714,467 B2* | 7/2017 | Kato | .................... | C23C 16/4584 |
| 9,777,369 B2* | 10/2017 | Kato | .................... | C23C 16/345 |
| 9,790,597 B2* | 10/2017 | Yamaga | ............ | C23C 16/45544 |
| 9,831,067 B2* | 11/2017 | Iwasaki | ................. | C23C 16/345 |
| 9,831,099 B2* | 11/2017 | O'Meara | ........... | H01L 21/02123 |
| 9,932,674 B2* | 4/2018 | Kato | ........................ | C23C 16/54 |
| 2010/0055347 A1* | 3/2010 | Kato | .................... | C23C 16/452 |
| | | | | 427/569 |
| 2011/0000619 A1* | 1/2011 | Suh | ........................ | H01J 37/321 |
| | | | | 156/345.33 |
| 2014/0170859 A1* | 6/2014 | Yamawaku | ........ | H01L 21/68764 |
| | | | | 438/778 |
| 2014/0216345 A1* | 8/2014 | Yamazawa | ............ | H01J 37/321 |
| | | | | 118/723 I |
| 2014/0216346 A1* | 8/2014 | Yamazawa | ............ | H01J 37/321 |
| | | | | 118/723 IR |
| 2014/0263179 A1* | 9/2014 | Waldfried | ......... | H01J 37/32266 |
| | | | | 216/61 |
| 2015/0132505 A1* | 5/2015 | Kato | .................... | H01J 37/3211 |
| | | | | 427/569 |
| 2015/0232993 A1* | 8/2015 | Iwao | ................. | C23C 16/45536 |
| | | | | 118/723 AN |
| 2016/0362789 A1* | 12/2016 | Yoshikawa | ........ | C23C 16/45551 |
| 2016/0379801 A1* | 12/2016 | Suh | ........................ | H01J 37/3211 |
| | | | | 156/345.49 |
| 2017/0110289 A1* | 4/2017 | Nishio | .................. | H01J 37/321 |
| 2017/0287677 A1* | 10/2017 | Kato | .................... | H01J 37/3211 |

* cited by examiner

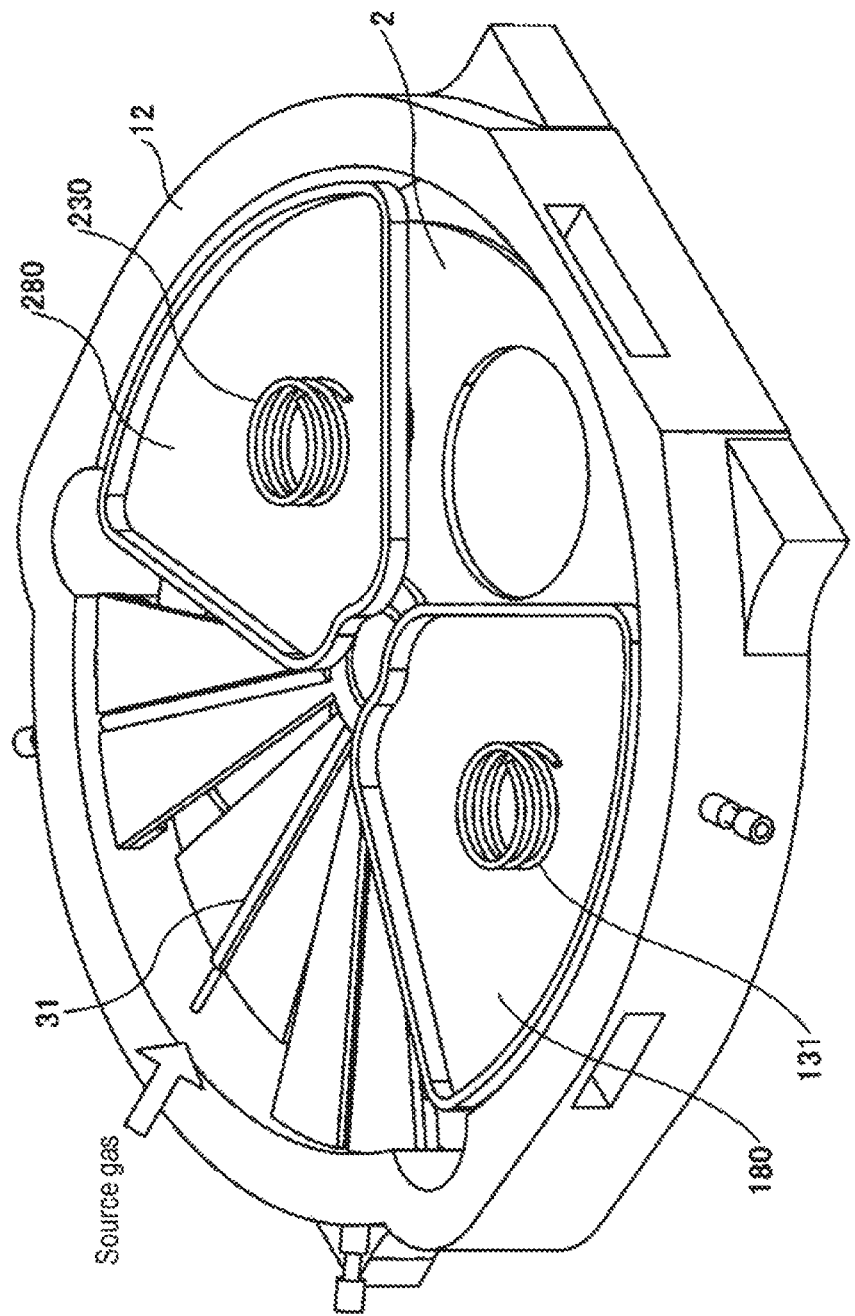

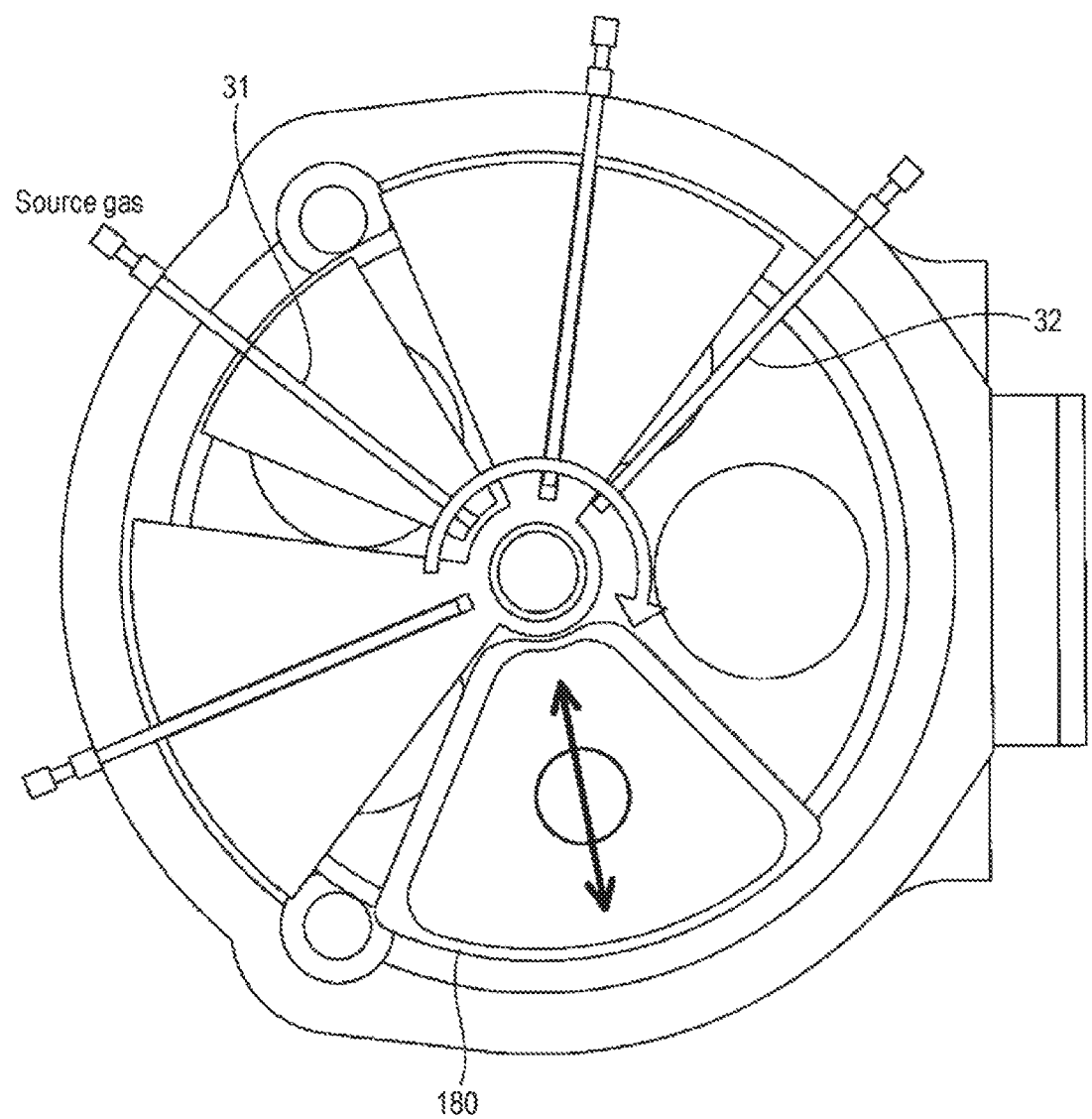

PLASMA PROCESSING APPARATUS AND PLASMA PROCESSING METHOD

CROSS-REFERENCE TO RELATED APPLICATION

This application claims the benefit of Japanese Patent Application No. 2016-065238, filed on Mar. 29, 2016, in the Japanese Patent Office, the disclosure of which is incorporated herein in its entirety by reference.

TECHNICAL FIELD

The present disclosure relates to a plasma processing apparatus and a plasma processing method.

BACKGROUND

In the related art, a film forming apparatus is known which performs a film forming process on a substrate by carrying out a cycle to sequentially supply first and second process gases within a vacuum chamber a plurality of times. The film forming apparatus includes: a rotation table having a substrate mounting region formed on one surface thereof for mounting substrates and configured to revolve the substrate mounting region within the vacuum chamber; first and second process gas supply parts configured to respectively supply first and second process gases to regions separated from each other by separation regions in the circumferential direction of the rotation table; a plasma generation gas supply part configured to supply plasma generation gas into the vacuum chamber in order to perform plasma processing on the substrates; and a plasma generation part including an antenna and a Faraday shield, the antenna being installed to face the substrate mounting region and wound around a vertical axis in order to bring the plasma generation gas into plasma by inductive coupling, and the Faraday shield being made of a grounded conductive plate and interposed between the antenna and the substrate in order to prevent penetration of an electric field component of an electromagnetic field generated around the antenna.

However, in the above-described configuration of the plasma generation part, since the antenna is installed in a state where it is secured to cover a part of a radius of the rotation table, there is a difference in the time period to apply plasma between a central region and an outer circumferential region of the rotation table, which causes a difference in a plasma application time. In other words, when the rotation table rotates at a predetermined rotational speed, the central region in the radial direction of the rotation table moves at a lower speed in a circumferential direction, whereas the outer circumferential region in the radial direction of the rotation table moves at a higher speed in the circumferential direction. Due to this, when plasma is uniformly generated in the radial direction, the plasma application time in the outer circumferential region is shorter than the plasma application time in the central region. As a result, a plasma throughput in the outer circumferential region may be less than that the plasma throughput in the central region.

SUMMARY

Some embodiments of the present disclosure provide a plasma processing apparatus and a plasma processing method that may regulate a plasma throughput in a radial direction of a rotation table in a plasma process where a plasma application is performed while rotating the rotation table having substrates mounted thereon in the circumferential direction.

According to an embodiment of the present disclosure, a plasma processing apparatus is provided. The plasma processing apparatus includes: a processing chamber; a rotation table installed in the processing chamber and capable of loading substrates on an upper surface thereof along a circumferential direction of the rotation table; and a plasma generator including an antenna located above an upper surface of the processing chamber and installed to be able to move in a radial direction of the rotation table, wherein the plasma generator is capable of locally applying plasma to the rotation table in the radial direction.

According to another embodiment of the present disclosure, a plasma processing method is provided. The plasma processing method includes: rotating a rotation table installed in a processing chamber and having at least one substrate loaded on a surface of the rotation table along a circumferential direction of the rotation table; and generating plasma while moving an antenna installed above an upper surface of the processing chamber in a radial direction of the rotation table, and locally applying the plasma to the substrate in the radial direction of the rotation table.

BRIEF DESCRIPTION OF THE DRAWINGS

The accompanying drawings, which are incorporated in and constitute a part of the disclosure, illustrate embodiments of the present disclosure and, together with the general description given above and the detailed description of the embodiments given below, serve to explain the principles of the present disclosure.

FIG. 13A is a top view of the antenna part and the Faraday shield in the example of the second plasma generator, and FIG. 13B is a side view of the antenna part and the Faraday shield in the example of the second plasma generator.

FIG. 14 is a view illustrating an example of a plasma processing apparatus according to a third embodiment of the present disclosure.

FIG. 15 is a view illustrating an example of a plasma processing apparatus according to a fourth embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of Plasma Processing Apparatus>

Figure 1:
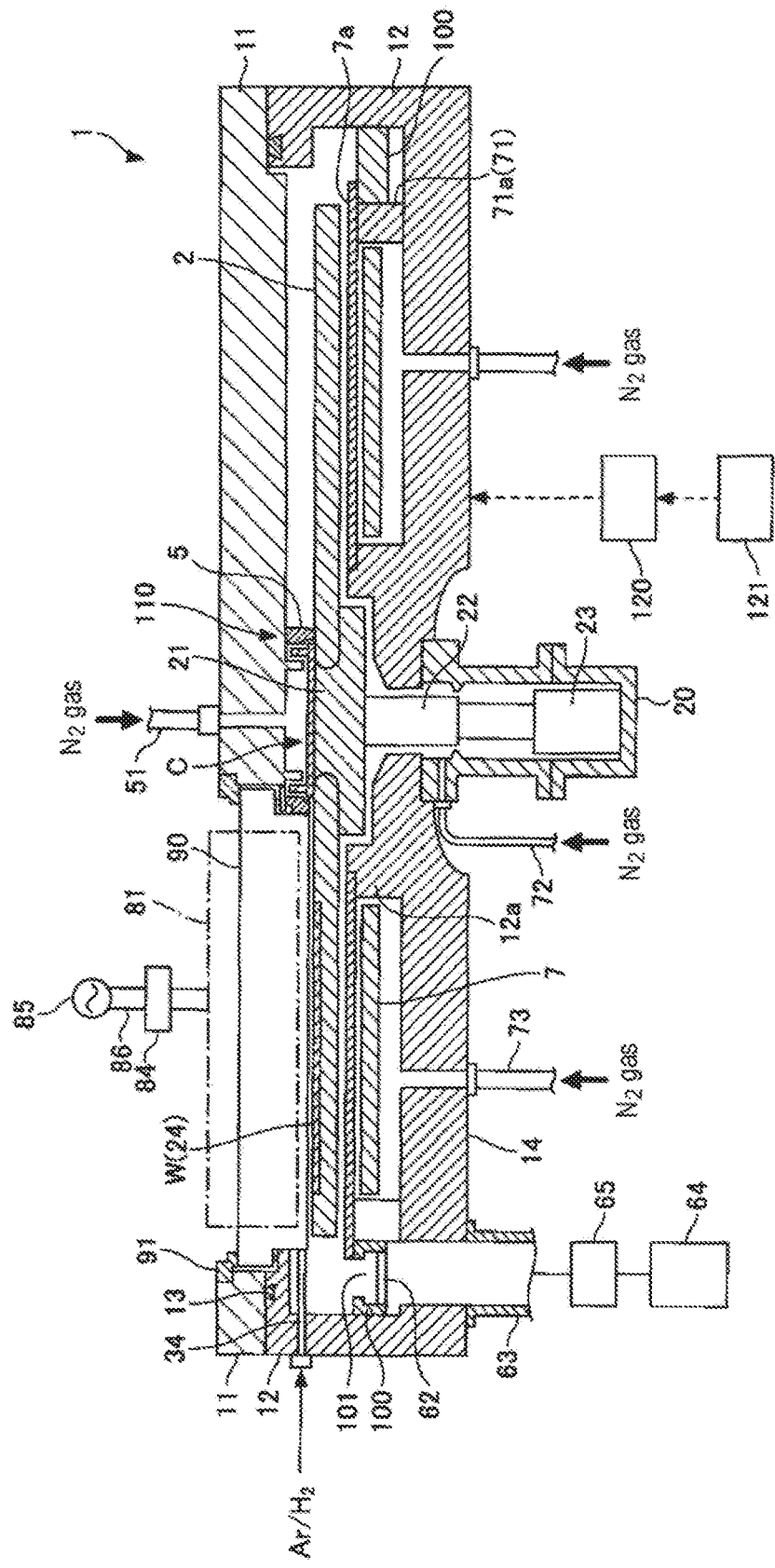
FIG. 1 is a schematic longitudinal sectional view of an example of a plasma processing apparatus according to a first embodiment of the present disclosure.
Figure 2:
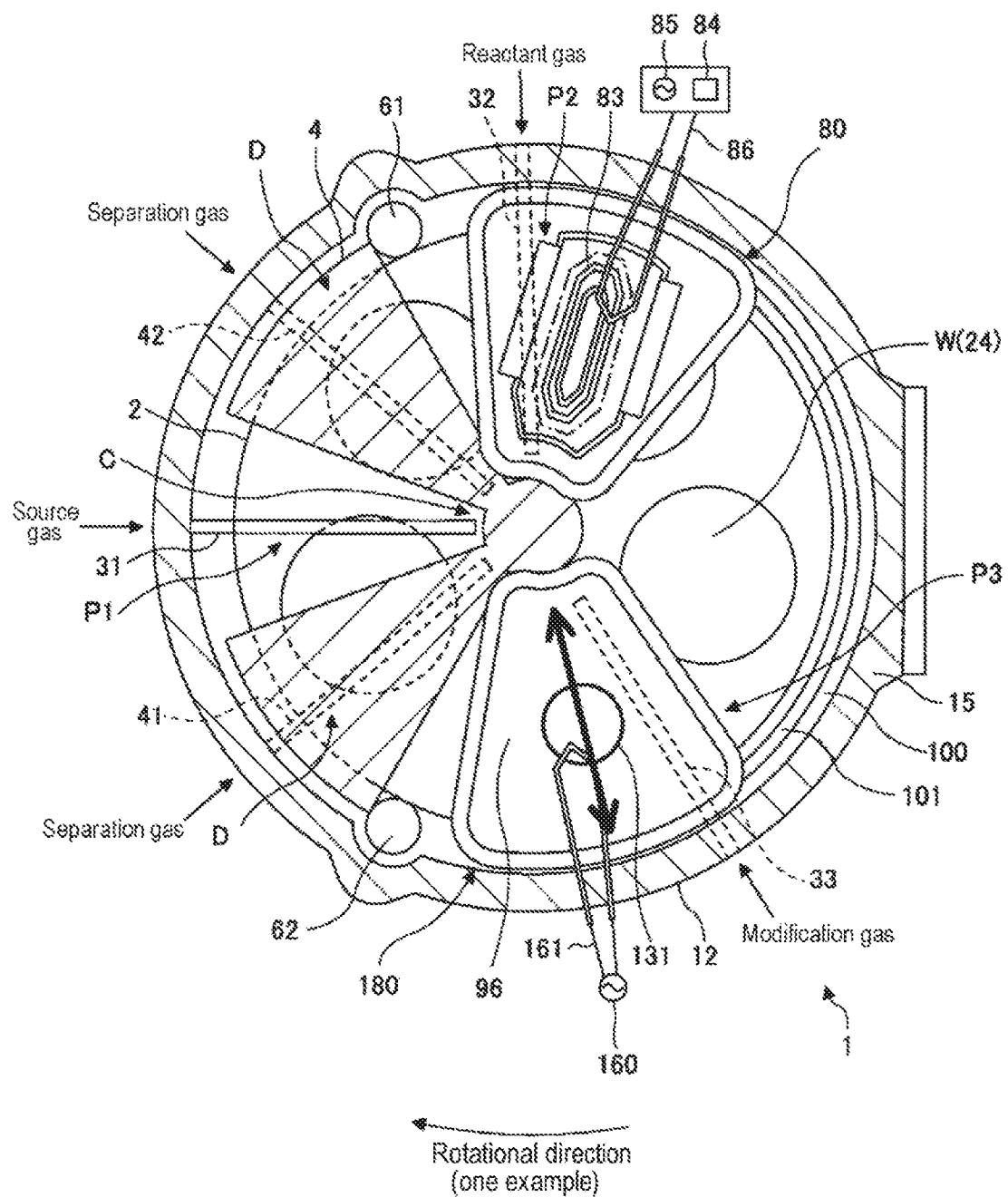
FIG. 2 is a schematic top view of an example of the plasma processing apparatus according to the first embodiment of the present disclosure.

FIG. 1 is a schematic longitudinal sectional view of an example of a plasma processing apparatus according to a first embodiment of the present disclosure. FIG. 2 is a schematic top view of an example of the plasma processing apparatus according to the first embodiment of the present disclosure. For the convenience of description, the drawing of a ceiling plate 11 is omitted in FIG. 2.

As illustrated in FIG. 1, the plasma processing apparatus, according to the first embodiment of the present disclosure, includes a vacuum chamber 1 having an approximately circular planar shape and a rotation table 2 installed inside the vacuum chamber 1 and configured to rotate wafers W around its rotation center aligned with a center of the vacuum chamber 1. The plasma processing apparatus according to the embodiment of the present disclosure may be applied to the entire substrate processing of loading substrates on the rotation table 2 in the circumferential direction thereof and performing plasma processing on the substrates while rotating the rotation table 2, and may also be applied to an annealing apparatus, etc., in addition to a film forming apparatus. However, it will be exemplified in this embodiment that the plasma processing apparatus is applied to a film forming apparatus.

The vacuum chamber 1 is a processing chamber in which substrates are processed. The vacuum chamber 1 includes a ceiling plate (a ceiling part) 11 installed in the position that faces concave portions 24 of the rotation table 2, which will be described below, and a chamber main body 12. A seal member 13 having a ring shape is installed on a periphery of an upper surface of the chamber main body 12. The ceiling plate 11 is configured to be detachable from the chamber main body 12. The vacuum chamber 1 may have a diameter (inner diameter) of, for example, about 1100 mm when viewed from above, but is not limited thereto.

A separation gas supply pipe 51 is connected to a central portion of an upper surface inside the vacuum chamber 1 to supply a separation gas in order to restrict different process gases from being mixed in a central region C within the vacuum chamber 1.

A center portion of the rotation table 2 is secured to a core part 21 having an approximately cylindrical shape, and is configured to be rotatable around a rotation shaft 22, which is connected to the lower surface of the core part 21 and extends in the vertical direction, by a drive part 23 in the clockwise direction in the example illustrated in FIG. 2. The rotation table 2 may have a diameter of, for example, about 1000 mm, but is not limited thereto.

The rotation shaft 22 and the drive part 23 are received in a case body 20. An upper flange part of the case body 20 is air-tightly provided on a lower surface of a bottom surface portion 14 of the vacuum chamber 1. Further, a purge gas supply pipe 72 is connected to the case body 20 in order to supply a nitrogen gas, etc. as a purge gas (separation gas) to a region below the rotation table 2.

An outer circumferential side of the core part 21 of the bottom surface portion 14 is formed into a ring shape so as to be close to the rotation table 2 from below, thus forming a protruding portion 12a.

The circular concave portions 24 as substrate loading regions for loading wafers W having a diameter of, for example, 300 mm are formed on the surface of the rotation table 2. The concave portions 24 are formed in multiple positions, for example, five positions along the rotational direction of the rotation table 2. The concave portions 24 have an inner diameter that is slightly (specifically, about 1 mm to about 4 mm) larger than the diameter of the wafers W. Further, the concave portion 24 has a depth that is nearly equal to, or greater than, the thickness of the wafers W. Accordingly, when the wafers W are received in the concave portions 24, the surfaces of the wafers W are at the same level as, or lower than, a surface of a region of the rotation table 2 on which no wafer W is loaded. When the depth of the concave portion 24 is greater than the thickness of the wafer W, a film forming process may be affected if the concave portion 24 is made too deep. Therefore, the concave portions 24 may have a depth about three times the thickness of the wafer W.

The concave portion 24 has through-holes (not shown) formed on the bottom surface of the concave portion 24. Through the through-holes, for example, three lifting pins to be described below are inserted to push up the wafer W received in the concave portion 24 from below, thus elevating the wafer W.

As illustrated in FIG. 2, a plurality of nozzles, for example, five nozzles 31, 32, 33, 41, and 42 that are made of, for example, quartz are radially arranged at positions facing passage regions of the concave portions 24 in the rotation table 2, while being spaced apart from each other in the circumferential direction of the vacuum chamber 1. These nozzles 31, 32, 33, 41, and 42 are arranged between the rotation table 2 and the ceiling plate 11. For example, the nozzles 31, 32, 33, 41, and 42 are installed to horizontally extend from an outer circumferential wall toward the central region C of the vacuum chamber 1 so as to face the wafers W.

In the example illustrated in FIG. 2, a source gas nozzle 31, a separation gas nozzle 42, a first plasma process gas nozzle 32, a second plasma process gas nozzle 33, and a separation gas nozzle 41 are sequentially arranged in the clockwise direction (in the rotational direction of the rotation table 2). However, the film forming apparatus, according to this embodiment, is not limited thereto, and the rotational direction of the rotation table 2 may be the counterclockwise direction. In this case, the source gas nozzle 31, the separation gas nozzle 42, the first plasma process gas nozzle 32, the second plasma process gas nozzle 33, and the separation gas nozzle 41 are sequentially arranged in the counterclockwise direction.

Plasma generators 80 and 180 are installed above the first and second plasma process gas nozzles 32 and 33, respectively, as illustrated in FIG. 2 to activate gases discharged from the respective plasma process gas nozzles. The first and second plasma generators 80 and 180 have different configurations. An antenna 83 of the first plasma generator 80 is configured to be stationary, whereas an antenna 131 of the second plasma generator 180 is configured to be movable. Detailed descriptions of the plasma generators 80 and 180 will be given below.

While one nozzle is disposed in each process region in this embodiment, a plurality of nozzles may be arranged in each process region. For example, the first plasma process gas nozzle 32 may be configured with a plurality of plasma process gas nozzles that supply an argon gas, an oxidizing gas or a nitrifying gas, a hydrogen ($H_2$) gas, etc, respectively, and may be configured with only one plasma process gas nozzle that supplies a mixture of an argon gas, an oxidizing or nitrifying gas, and a hydrogen gas.

The process gas nozzle 31 forms a source gas supply part. The first plasma process gas nozzle 32 forms a first plasma process gas supply part, and the second plasma process gas nozzle 33 forms a second plasma process gas supply part. The separation gas nozzles 41 and 42 form separation gas supply parts, respectively. A separation gas may be referred to as a purge gas, as described above.

The nozzles 31, 32, 33, 41, and 42 are connected to gas supply sources (not shown) through flow-rate regulation valves, respectively.

Various process gases may be selected as a source gas supplied through the source gas nozzle 31, depending on applications. For example, the source gas may be a silicon-containing gas. Further, examples of the silicon-containing gas may include a dichloro silane (DCS) gas, a disilane gas ($Si_2H_6$), a hexachloro disilane (HCD) gas, a diisopropyl amino silane (DIPAS), a tris(dimethyl amino) silane (3DMAS) gas, a bis-tertiary butyl amino silane (BTBAS) gas, etc.

As a source gas supplied through the source gas nozzle 31, a metal-containing gas, in addition to the silicon-containing gas, may be used, such as a titanium tetrachloride ($TiCl_4$) gas, a titanium (methyl pentane dionate) bis(tetra methyl heptane dionate) (Ti(MPD)(THD)) gas, a trimethyl aluminum (TMA) gas, a tetrakis ethylmethyl amino zirconium (TEMAZ) gas, a tetrakis ethylmethyl amino hafnium (TEMHF) gas, a bis(tetra methyl heptane dionate) strontium ($Sr(THD)_2$), etc.

A reactant gas capable of reacting with the source gas supplied through the source gas nozzle 31 to generate a reaction product is selected as a first plasma process gas supplied through the first plasma process gas nozzle 32. In general, an oxidizing gas used to form an oxide film or a nitrifying gas used to form a nitride film is selected. Examples of the oxidizing gas may include oxygen-containing gases, such as ozone, oxygen, water, etc. Examples of the nitrifying gas may include nitrogen-containing gases, such as ammonia ($NH_3$), etc. The first plasma process gas may include an $H_2$ gas, an Ar gas, etc. as necessary, in addition to the reactant gas reacting with the source gas, such as an oxidizing gas, a nitrifying gas, etc., to generate the reaction product. In such a case, a mixture of those gases is supplied through the first plasma process gas nozzle 32 and is brought into plasma by the first plasma generator 80.

A gas including a reactant gas similar to the first plasma process gas is selected as a second plasma process gas supplied through the second plasma process gas nozzle 33, since the second plasma process gas is used for a process to modify the generated reaction product. Accordingly, in a case where the first plasma process gas is an oxidizing gas, the second plasma process gas is also determined to be an oxidizing gas, and in a case where the first plasma process gas is a nitrifying gas, the second plasma process gas is also determined to be a nitrifying gas. Even though a reaction product is generated by a reaction of the source gas with the first plasma process gas, a high-density and high-quality film may not be obtained if oxidation or nitrification is insufficient. Accordingly, a modification gas similar to the reactant gas is supplied through the second plasma process gas nozzle 33.

Separation gases supplied through the separation gas nozzles 41 and 42 may include, for example, a nitrogen ($N_2$) gas, etc.

As described above, in the example illustrated in FIG. 2, the source gas nozzle 31, the separation gas nozzle 42, the first plasma process gas nozzle 32, the second plasma process gas nozzle 33, and the separation gas nozzle 41 are sequentially arranged in the clockwise direction (in the rotational direction of the rotation table 2). In other words, in the actual processing of the wafers W, the wafers W onto which the source gas supplied through the source gas nozzle 31 has been adsorbed are exposed to the separation gas from the separation gas nozzle 42, the reactant gas from the first plasma process gas nozzle 32, the modification gas from the second plasma process gas nozzle 33, and the separation gas from the separation gas nozzle 41 in sequence.

Figure 3:
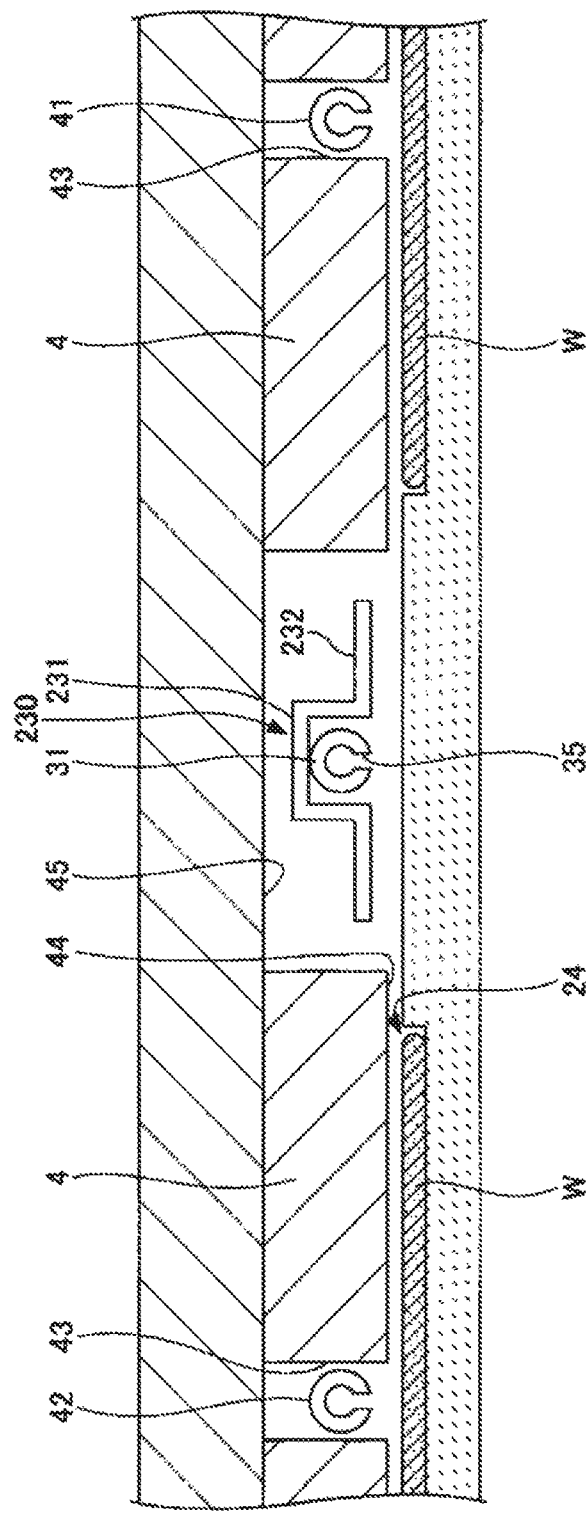
FIG. 3 is a sectional view according to a concentric circle of a rotation table of the plasma processing apparatus according to the first embodiment of the present disclosure.

As can be seen from FIG. 3, each of the nozzles 31, 32, 33, 41, and 42 has a plurality of gas discharge holes 35 for respectively discharging the gases described above, which are formed on a lower surface side of the nozzle (facing the rotation table 2) along the radial direction of the rotation table 2, for example, with an equal interval therebetween (see FIG. 3). The nozzles 31, 32, 33, 41, and 42 are disposed such that lower end edges thereof are spaced apart from the upper surface of the rotation table 2 by a separation distance of, for example, about 1 mm to about 5 mm.

A region below the source gas nozzle 31 is a first process region P1 for adsorbing a Si-containing gas onto the wafers W. A region below the first plasma process gas nozzle 32 is a second process region P2 for performing a first plasma process on thin films of the wafers W, and a region below the second plasma process gas nozzle 33 is a third process region P3 for performing a second plasma process on the thin films of the wafers W.

FIG. 3 is a sectional view according to a concentric circle of the rotation table of the plasma processing apparatus according to the first embodiment of the present disclosure. FIG. 3 is a sectional view from a separation region D via the first process region P1 to a separation region D.

In each separation region D, a convex part 4 which has a fan shape approximately is formed on the ceiling plate 11 of the vacuum chamber 1. The convex part 4 is provided on the back side of the ceiling plate 11, and a flat lower ceiling surface 44 (a first ceiling surface), which is the lower surface of the convex part 4, and a higher ceiling surface 45 (a second ceiling surface), which is located on opposite sides of the ceiling surface 44 in the circumferential direction and is higher than the ceiling surface 44, are formed in the vacuum chamber 1.

The convex part 4 forming the ceiling surface 44 has a fan-like planar shape with a top portion thereof cut in a circular arc shape, as illustrated in FIG. 2. The convex parts 4 have grooves 43 formed at the center thereof in the circumferential direction to extend in the radial direction, and the separation gas nozzles 41 and 42 are received in the grooves 43. A circumferential portion of the convex part 4 (the portion adjacent to an outer edge side of the vacuum chamber 1) is bent in an L shape so as to be slightly spaced apart from the chamber main body 12 while facing an outer end surface of the rotation table 2 in order to prevent the process gases from being mixed.

A nozzle cover 230 is provided above the source gas nozzle 31 in order to make the first process gas flow throughout the wafer W and to make the separation gases flow throughout the ceiling plate 11 of the vacuum chamber 1 while avoiding the vicinity of the wafer W. As illustrated in FIG. 3, the nozzle cover 230 includes: a substantially box-shaped cover body 231 that is open at its bottom surface side so as to receive the source gas nozzle 31 therein; and rectifying plates 232 which are plate-shaped bodies respectively connected to upstream and downstream sides of an open end at the bottom surface side of the cover body 231, in the rotational direction of the rotation table 2. A sidewall surface of the cover body 231 on a rotation center side of the rotation table 2 extends toward the rotation table 2 to face a tip end portion of the source gas nozzle 31. Further, the sidewall surface of the cover body 231 on the outer edge side of the rotation table 2 is cut out so as not to interfere with the source gas nozzle 31.

Next, the first and second plasma generators 80 and 180, which are disposed above the plasma process gas nozzles 32 and 33, respectively, will be described in detail. In this embodiment, the first and second plasma generators 80 and 180 may have different configurations and may carry out independent plasma processes respectively.

Figure 4:
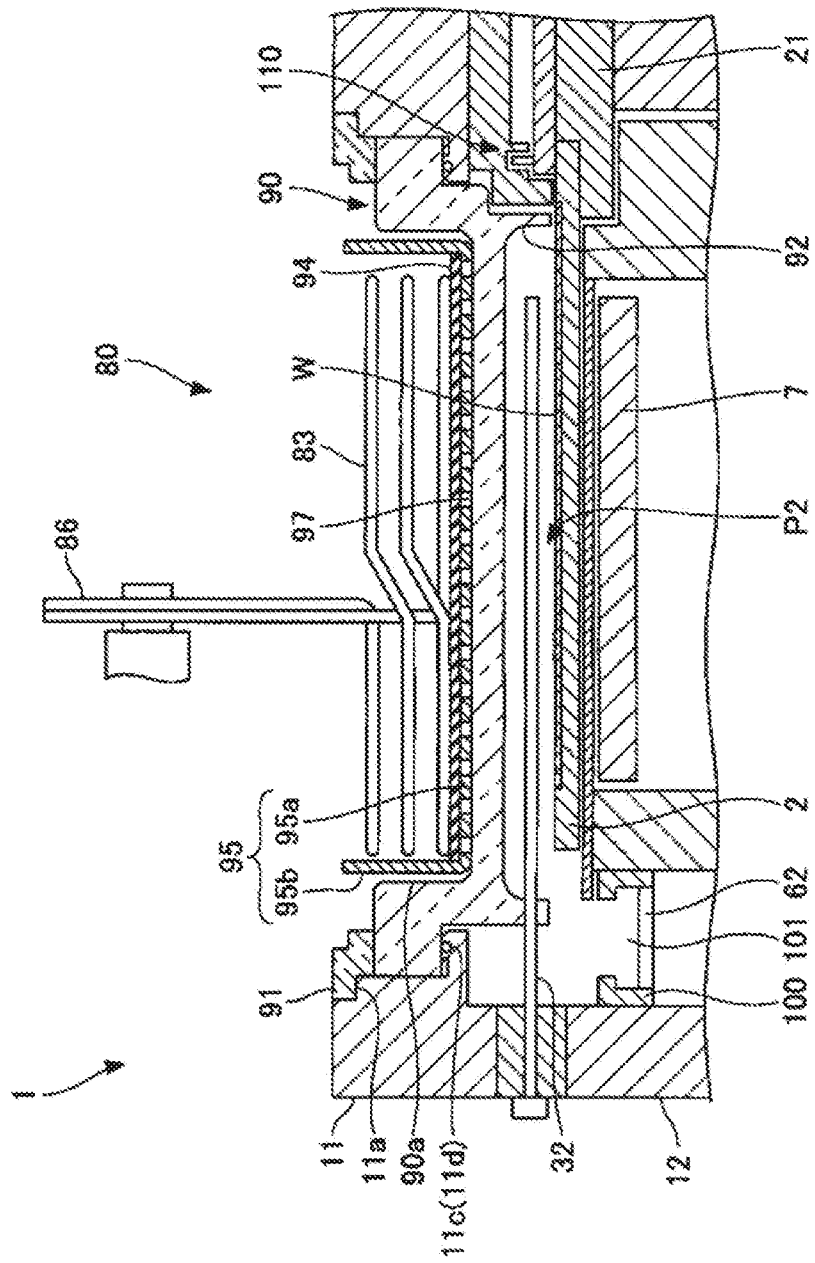
FIG. 4 is a longitudinal sectional view illustrating an example of a first plasma generator of the plasma processing apparatus according to the first embodiment of the present disclosure.
Figure 5:
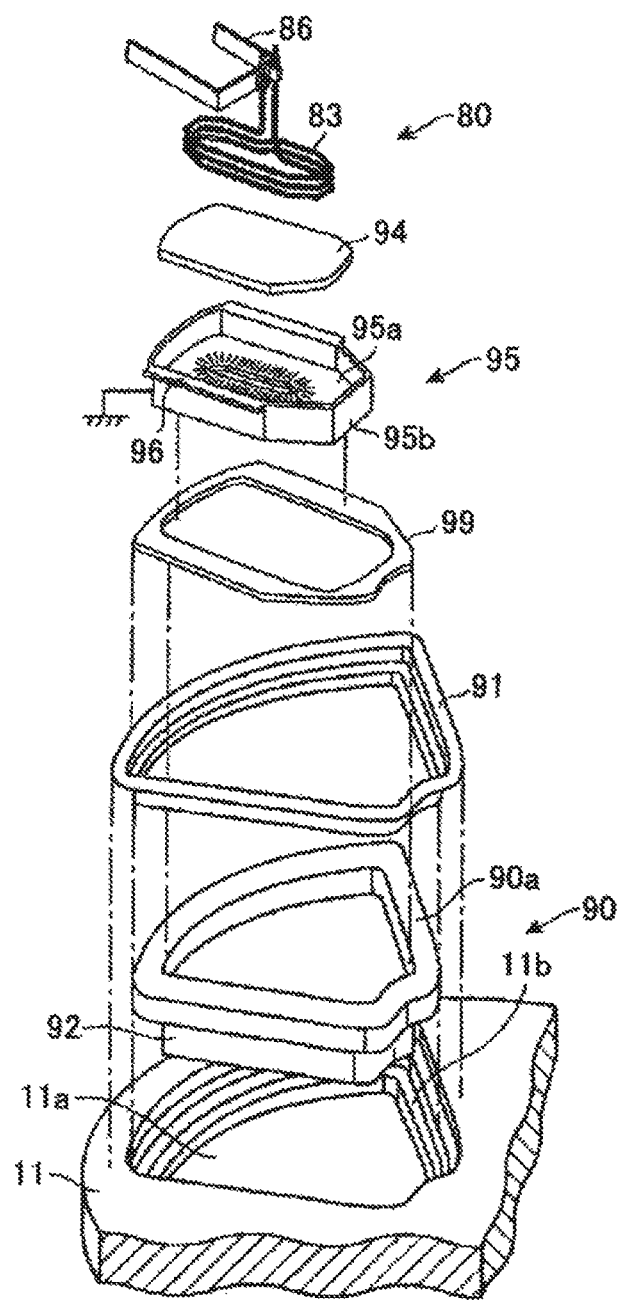
FIG. 5 is an exploded perspective view illustrating an example of the first plasma generator of the plasma processing apparatus according to the first embodiment of the present disclosure.
Figure 6:
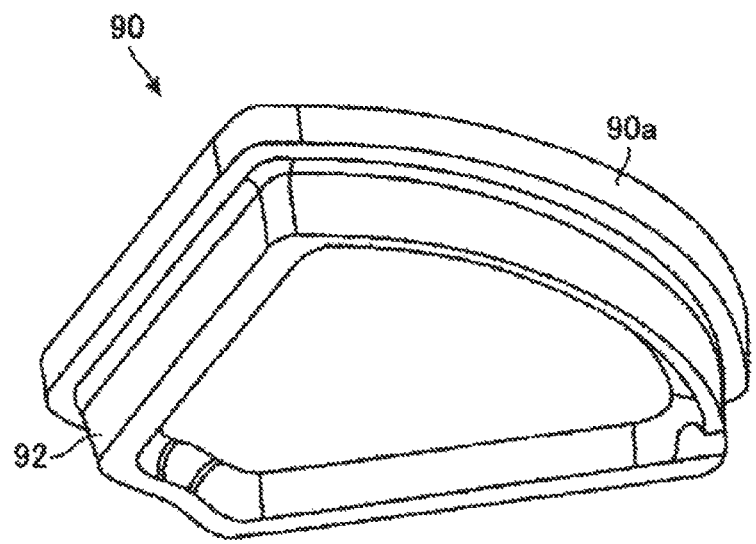
FIG. 6 is a perspective view illustrating an example of a housing installed in the first and second plasma generators of the plasma processing apparatus according to the first embodiment of the present disclosure.

FIG. 4 is a longitudinal sectional view illustrating one example of the first plasma generator of the plasma processing apparatus according to the first embodiment of the present disclosure. FIG. 5 is an exploded perspective view illustrating an example of the first plasma generator of the plasma processing apparatus according to the first embodiment of the present disclosure. FIG. 6 is a perspective view illustrating one example of a housing installed in the first and second plasma generators of the plasma processing apparatus according to the first embodiment of the present disclosure. In the following embodiments, the first plasma generator 80 may be briefly referred to as the plasma generator 80, and the second plasma generator 180 may be briefly referred to as the plasma generator 180.

The plasma generator 80 is configured by winding an antenna 83 formed of a metal wire or the like in a coil shape, for example, three times around a vertical axis. The plasma generator 80 is disposed to surround a band-like body region extending in the radial direction of the rotation table 2 and to straddle a diameter portion of a wafer W on the rotation table 2 in plan view.

The antenna 83 is connected, through a matching device 84, to a high-frequency power supply 85 operating at a frequency of, for example, 13.56 MHz and having an output power of, for example, 5000 W. The antenna 83 is installed to be air-tightly separated from the internal region of the vacuum chamber 1. In FIG. 4, a connecting electrode 86 is provided to electrically connect the antenna 83, the matching machine 84, and the high-frequency power supply 85.

As illustrated in FIGS. 4 and 5, an opening 11a, which is open substantially in a fan-like shape in plan view, is formed in the ceiling plate 11 above the first plasma process gas nozzle 32.

As illustrated in FIG. 4, the housing 90 is installed in the opening 11a in order to locate the antenna 83 in a lower position than the ceiling plate 11.

As illustrated in FIG. 6, an upper circumferential portion of the housing 90 horizontally extends in a flange shape along the circumferential direction to form a flange portion 90a, and a central portion of the housing 90 is formed to be recessed toward an internal region of the vacuum chamber 1 on a lower side in plan view.

The housing 90 is disposed to straddle the diameter portion of a wafer W in the radial direction of the rotation table 2 when the wafer W is located below the housing 90. Furthermore, a seal member 11c, such as an O-ring, is provided between the housing 90 and the ceiling plate 11.

The internal atmosphere of the vacuum chamber 1 is tightly sealed by the housing 90. Specifically, when the housing 90 is inserted into the above-described opening 11a, the flange 90a and the lowermost step portion 11b are engaged with each other. The step portion 11b (the ceiling plate 11) and the housing 90 are air-tightly connected by the above-described O-ring 11d. Further, the internal atmosphere of the vacuum chamber 1 is air-tightly sealed by pressing the flange 90a downward along the circumferential direction using a pressing member 91 formed in a frame shape along the outer edge of the opening 11a and fixing the pressing member 91 to the ceiling plate 11 with bolts (not shown).

As illustrated in FIG. 6, a protrusion 92 is formed on the lower surface of the housing 90. The protrusion 92 vertically extends toward the rotation table 2 to surround each of the process region P2 and P3 below the housing 90 in the circumferential direction. The above-described first and second plasma process gas nozzle 32 and 33 are housed in a region surrounded by an inner circumferential surface of the protrusion 92, the lower surface of the housing 90, and the upper surface of the rotation table 2. A part of the protrusion 92 in a base end portion of the first or second plasma process gas nozzle 32 or 33 (on an inner wall side of the vacuum chamber 1) is cut out substantially in an arc shape to correspond to an outer shape of the first or second plasma process gas nozzle 32 or 33.

The protrusion 92 is formed on the lower side of the housing 90 in the circumferential direction, as illustrated in FIG. 4. The seal member 11c is not directly exposed to plasma by means of the protrusion 92. In other words, the seal member 11c is isolated from the plasma generation region by the protrusion 92. Due to this, even though plasma tends to spread from the plasma generation region, for example, toward the seal member 11c, the plasma is deactivated before reaching the seal member 11c since the plasma goes through the lower side of the protrusion 92.

A grounded Faraday shield 95 is accommodated in the upper portion of the housing 90. The Faraday shield 95 is formed of a conductive metal plate, for example, copper, to correspond to an internal shape of the housing 90. The Faraday shield 95 includes a horizontal surface 95a horizontally formed to along the bottom surface of the housing 90 and a vertical surface 95b extending upward from the outer end of the horizontal surface 95a in a circumferential direction thereof, and may have, for example, an approximately hexagonal shape in plan view.

Figure 7:
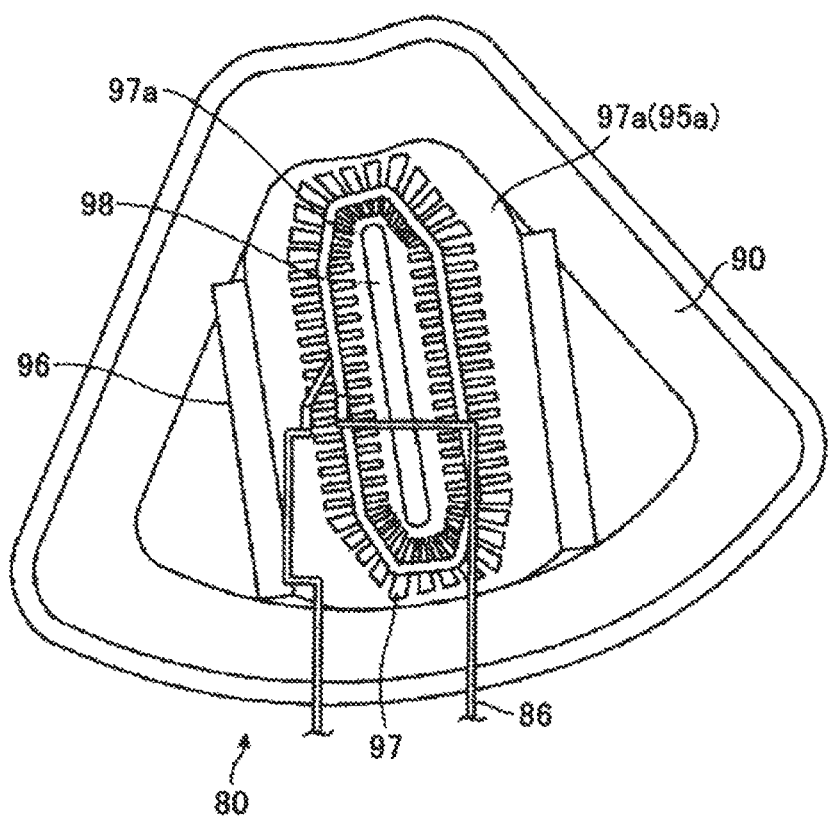
FIG. 7 is a top view illustrating an example of the first plasma generator of the plasma processing apparatus according to the first embodiment of the present disclosure.
Figure 8:
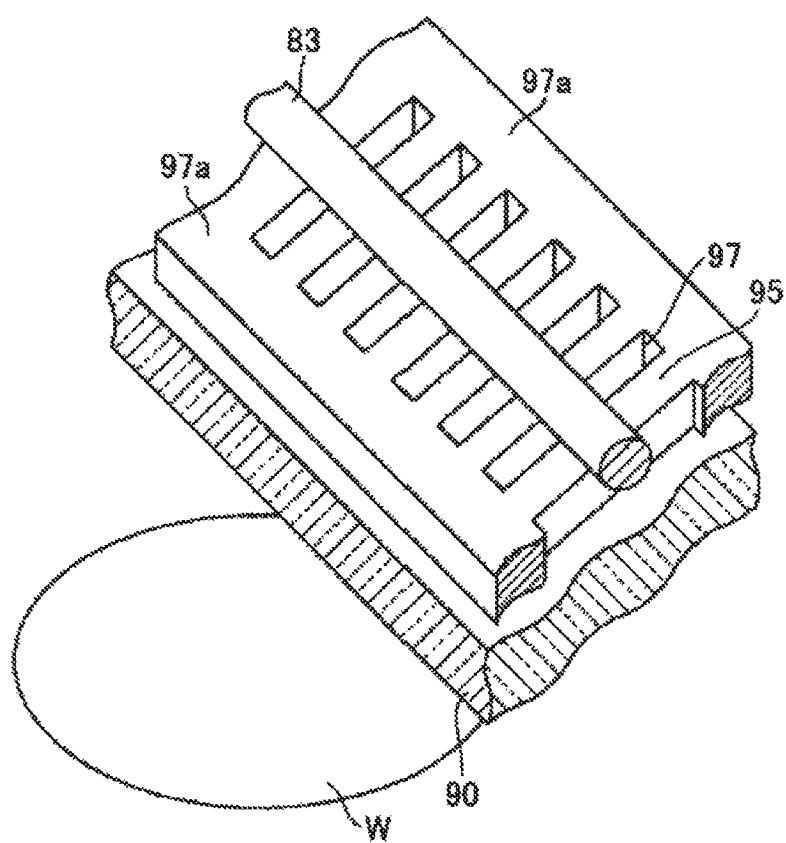
FIG. 8 is a perspective view illustrating a part of a Faraday shield installed in the plasma generator.

FIG. 7 is a top view illustrating one example of the plasma generator of the plasma processing apparatus according to the first embodiment of the present disclosure. FIG. 8 is a perspective view illustrating a part of the Faraday shield installed in the plasma generator.

When the Faraday shield 95 is viewed from the rotation center of the rotation table 2, the upper end edges on the right and left sides of the Faraday shield 95 horizontally extend to the left and right respectively to form support parts 96. A frame-shaped body 99 is installed between the Faraday shield 95 and the housing 90. The frame-shaped body 99 supports the support parts 96 from below and is supported by the flange 90a on the central region C side of the housing 90 and the flange 90a on the outer edge side of the rotation table 2.

When an electric field generated by the antenna 83 reaches a wafer W, a pattern (electrical wiring, etc.) formed within the wafer W may be electrically damaged. Due to this, a plurality of slits 97 are formed in the horizontal surface 95a, as illustrated in FIG. 8, in order to prevent the electric field component, among the electric field and the magnetic field (electromagnetic field) generated by the antenna 83, from being directed toward the wafer W below the antenna 83 and to allow the magnetic field reach the wafer W.

As illustrated in FIGS. 7 and 8, the slits 97 are formed below the antenna 83 along the circumferential direction to extend in the direction perpendicular to a direction in which the antenna 83 is wound. Here, the slits 97 are formed to have a width dimension less than or equal to about ¹⁄₁₀₀₀₀) of a wavelength corresponding to a high frequency supplied to the antenna 83. Further, conductive passages 97a formed of a grounded conductor or the like are arranged on one end side and the other end side in the longitudinal direction of each slit 97 along the circumferential direction so as to block an open end of the slit 97. An opening 98 is formed in a region other than the region where the slits 97 are formed in the Faraday shield 95, in other words, in the middle of the region where the antenna 83 is wound, in order to identify a light emitting state of plasma through the corresponding region. In FIG. 2 described above, the slits 97 are omitted for simplification, and the regions where the slits 97 are formed is shown by a dot and dash line.

As illustrated in FIG. 5, an insulating plate 94 having a thickness of, for example, about 2 mm and formed of quartz or the like is stacked on the horizontal surface 95a of the Faraday shield 95 in order to ensure an insulation between the Faraday shield 95 and the plasma generators 80 and 180 placed above the Faraday shield 95. In other words, each of the plasma generators 80 and 180 is disposed to face the interior of the vacuum chamber 1 (a wafer W on the rotation table 2) with the housing 90, the Faraday shield 95, and the insulating plate 94 interposed therebetween.

As described above, the first plasma generator 80 includes the antenna 83 fixed to the housing 90 installed on the ceiling plate 11 of the vacuum chamber 1. Meanwhile, the second plasma generator 180 differs from the first plasma generator 80 in that the former includes a movable antenna. Hereinafter, the second plasma generator 180 will be described in detail.

Figure 9:
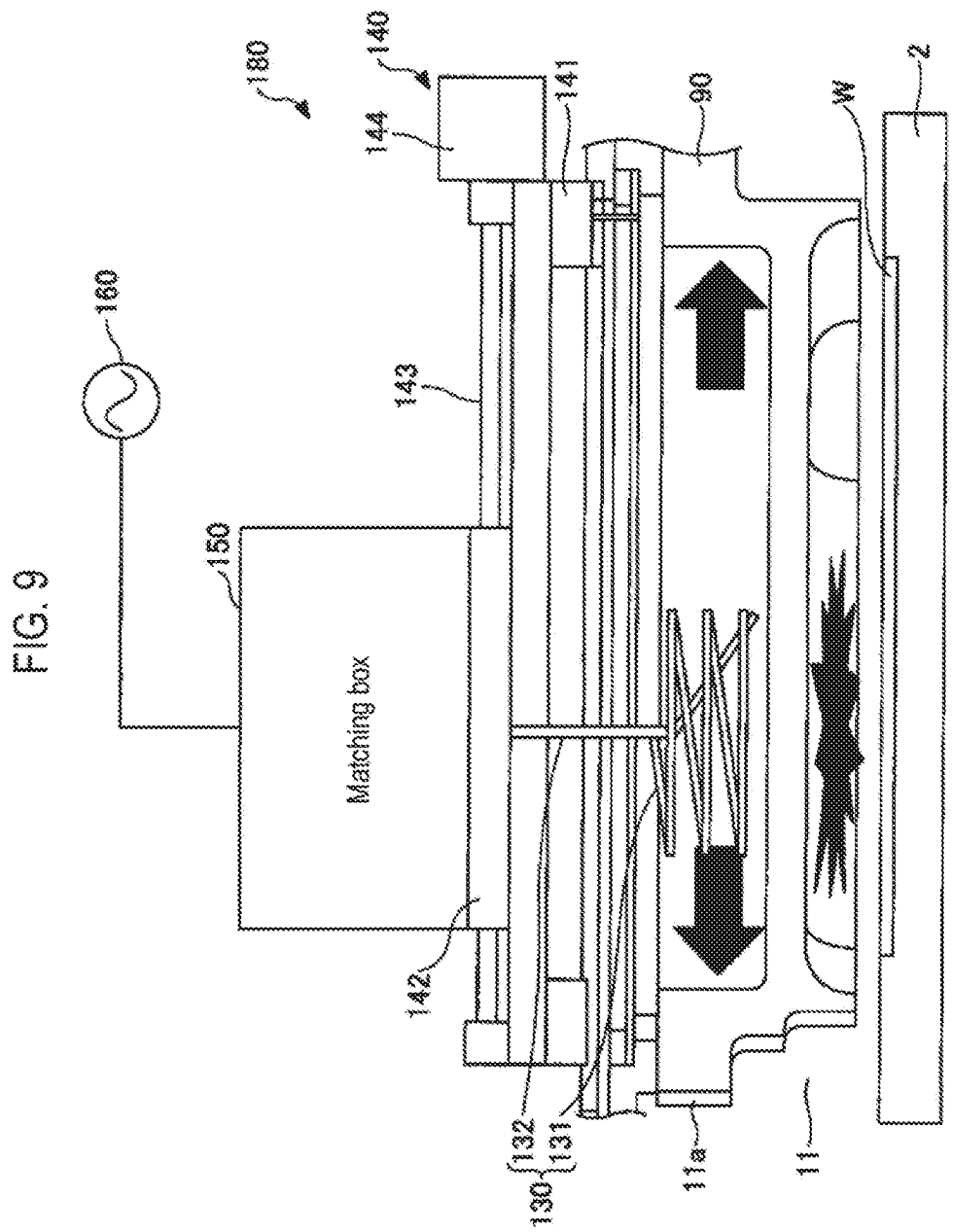
FIG. 9 is a view illustrating an example of the second plasma generator of the plasma processing apparatus according to the first embodiment of the present disclosure.

FIG. 9 illustrates one example of the second plasma generator of the plasma processing apparatus according to the first embodiment of the present disclosure. The second plasma generator 180 includes an antenna part 130, a moving mechanism 140, a matching device 150, and a power supply 160. The second plasma generator 180 significantly differs from the first plasma generator 80 in that the former includes the moving mechanism 140, and an antenna 131 and the matching device 150 are configured to be movable. However, the second plasma generator 180 is the same as the first plasma generator 80 in that the former is installed on a housing 90 mounted in the opening 11a of the ceiling plate 11 of the vacuum chamber 1. A description of the housing 90 will be omitted since the configuration of the housing 90 is the same as that described above with reference to FIGS. 5 to 7.

The antenna part 130 includes the antenna 131 and an antenna support part 132. The antenna 131 is an electrode for generating plasma. In this embodiment, the antenna 131 is configured with an Inductively Coupled Plasma (ICP) antenna for generating inductively coupled plasma. The antenna 131 has no limitation on the shape thereof, but has a length smaller than the radius of the rotation table 2 in the radial direction of the rotation table 2 in order to locally apply plasma in the radial direction of the rotation table 2. If the length of the antenna 131 in the radial direction is greater than a half of the radius of the rotation table 2, an overlapping area where plasma is always applied occurs even though the antenna 131 is moved. Accordingly, in some embodiments, the length in the radial direction of the antenna 131 may be set to a half or less of the radius of the rotation table. In order to locally apply plasma with high precision, the length of the antenna 131 in the radial direction of the rotation table 2 may be set to a value in the range of ⅕ to ½ of the radius of the rotation table 2, or may be set to a value in the range of ¼ to ½ or ⅓ to ½ of the radius of the rotation table 2. In some embodiments, the length of the antenna 131 in the radial direction is preferably set to about ⅓ of the radius of the rotation table 2.

While the antenna 131 has no limitation on the planar shape thereof, the antenna 131 may have, for example, a circular shape, an oval shape, or a rectangular shape including a square. In this embodiment, it will be exemplified that the antenna 131 has a circular plane shape, as illustrated in FIGS. 2 and 9. Likewise to the antenna 83, the antenna 131 may be configured by winding a metal wire in a coil shape multiple times, and has a coil shape (a helical shape or a substantially cylindrical shape) as illustrated in FIG. 9.

The antenna support part 132 is configured to support the antenna 131 and is connected to the antenna 131 to movably support the antenna 131. In FIG. 9, the antenna support part 132 is connected to the antenna 131 at an upper end portion of the antenna 131 to support the antenna 131 suspended therefrom. The antenna support part 132 is physically and electrically connected to the antenna 131. In other words, the antenna support part 132 is formed of a conductor to pass a high-frequency current therethrough, and is generally formed of a metal material. While the antenna support part 132 may be formed of the same metal material as or a different metal material from that of the antenna 131, the antenna support part 132 is formed to be thicker and more rigid than the metal wire employed for the antenna 131 to have a higher rigidity than the antenna 131 in order to support the antenna 131.

The moving mechanism 140 is a drive mechanism configured to move the antenna 131 in the radial direction of the rotation table 2. The moving mechanism 140 includes a frame 141, a slider 142, a ball screw 143, and a motor 144.

The frame 141 serves as a base for installing the moving mechanism 140 on the ceiling plate 11 constituting the upper surface of the vacuum chamber 1. As illustrated in FIG. 9, the frame 141 covering the radius of the rotation table 2 is installed above the housing 90 so that the moving mechanism may be mounted above the housing 90 to enable the antenna 131 to move within a concave portion of the housing 90. Accordingly, other components of the moving mechanism 140 are mounted on the frame 141. The frame 141 may have various shapes and may be formed of various materials as long as the frame 141 can support the moving mechanism 140. For example, the frame 141 is formed of a metal material.

The slider 142 is a member configured to slidably support the antenna 131. Accordingly, the antenna support part 132 is fixed to the slider 142, and the slider 142 is configured to slide on the frame 141 while supporting the antenna 131 suspended from the antenna support part 132.

The antenna 131 is supported by the slider 142 and the antenna support part 132 so as not to make contact with the upper surface of the housing 90 and is configured to move without making contact with the housing 90.

The moving direction of the slider 142, that is, the installation direction of the frame 141 does not have to be arranged along the radial direction of the rotation table 2 if the slider 142 can move over substantially the entire region in the radial direction of the rotation table 2, and, for example, may be set to intersect obliquely with respect to the radius of the rotation table 2. However, in some embodiments, in order to move the antenna 131 along the shortest route in the radial direction, the frame 141 may be installed along the radial direction of the rotation table 2 and the slider 142 is configured to be able to slide along the radial direction of the rotation table 2. In this embodiment, it will be exemplified that the frame 141 and the slider 142 are installed along the radial direction of the rotation table 2, as illustrated in FIG. 2.

The ball screw 143 is a guide member configured to guide a moving direction of a sliding movement of the slider 142. Accordingly, the ball screw 143 is provided at opposite ends of the frame 141 to define the moving direction of the slider 142 and extends along the radial direction of the rotation table 2. Further, the ball screw 143 also serves as a driving-force transmission part configured to transmit a driving force to the slider 142 to move the same.

More specifically, the ball screw 143 has screw threads formed on the surface thereof, and the slider 142 has a through-hole (not shown). On a surface of the through-hole, screw threads are formed to be screw-coupled with the ball screw 143. As the ball screw 143 rotates, the slider 142 moves along the extending ball screw 143.

The motor 144 generates a driving force to move the slider 142. The ball screw 143 is connected to a rotation shaft of the motor 144 so that the ball screw 143 rotates when the motor 144 rotates, and the slider 142 slides along the ball screw 143 accordingly. As a result, the antenna support part 132 and the antenna 131 slide together with the slider 142.

The motor 144 may be disposed on an outer circumferential side or an inner circumferential side (around the center) of the ceiling plate 11 of the vacuum chamber 1. The motor 144 may be disposed in an appropriate position according to its purpose.

While the slider 142 is moved by the ball screw 143 and the motor 144 in FIG. 9, a mechanism may be employed in which a rail, instead of the ball screw 143, to be engaged with the slider 142 is disposed and the slider 142 slides on the rail. In other words, if the moving mechanism 140 includes the slider 142 capable of sliding, a guide part configured to guide the moving direction of the slider 142, and a manual drive part configured to apply a driving force for moving the slider 142, the moving mechanism 140 may adopt various configurations.

While the matching device 150 is installed between the high-frequency power supply 160 and the antenna 131, the matching device 150 is integrally installed with the slider 142 in this embodiment. If the matching device 150 is fixed, the distance between the matching device 150 and the antenna 131 and the intensity of plasma vary according to a sliding movement of the antenna 131. Accordingly, the matching device 150 may be configured to move along with the antenna 131 in order to maintain the intensity of plasma at a constant level in some embodiments.

In this embodiment, the matching device 150 is mounted on the slider 142 supporting the antenna 131, but may be diversely configured to move with a constant distance from the antenna 131.

The high-frequency power supply 160 supplies high-frequency power to the antenna 131. The high-frequency power supply 160 may be diversely configured to supply the antenna 131 with high-frequency power necessary for generating a predetermined amount of plasma. For example, like the high-frequency power supply 85, the high-frequency power supply 160 may be a high-frequency power supply having an output of 5000 W or may output a high-frequency power of 13.56 MHz.

Figure 10:
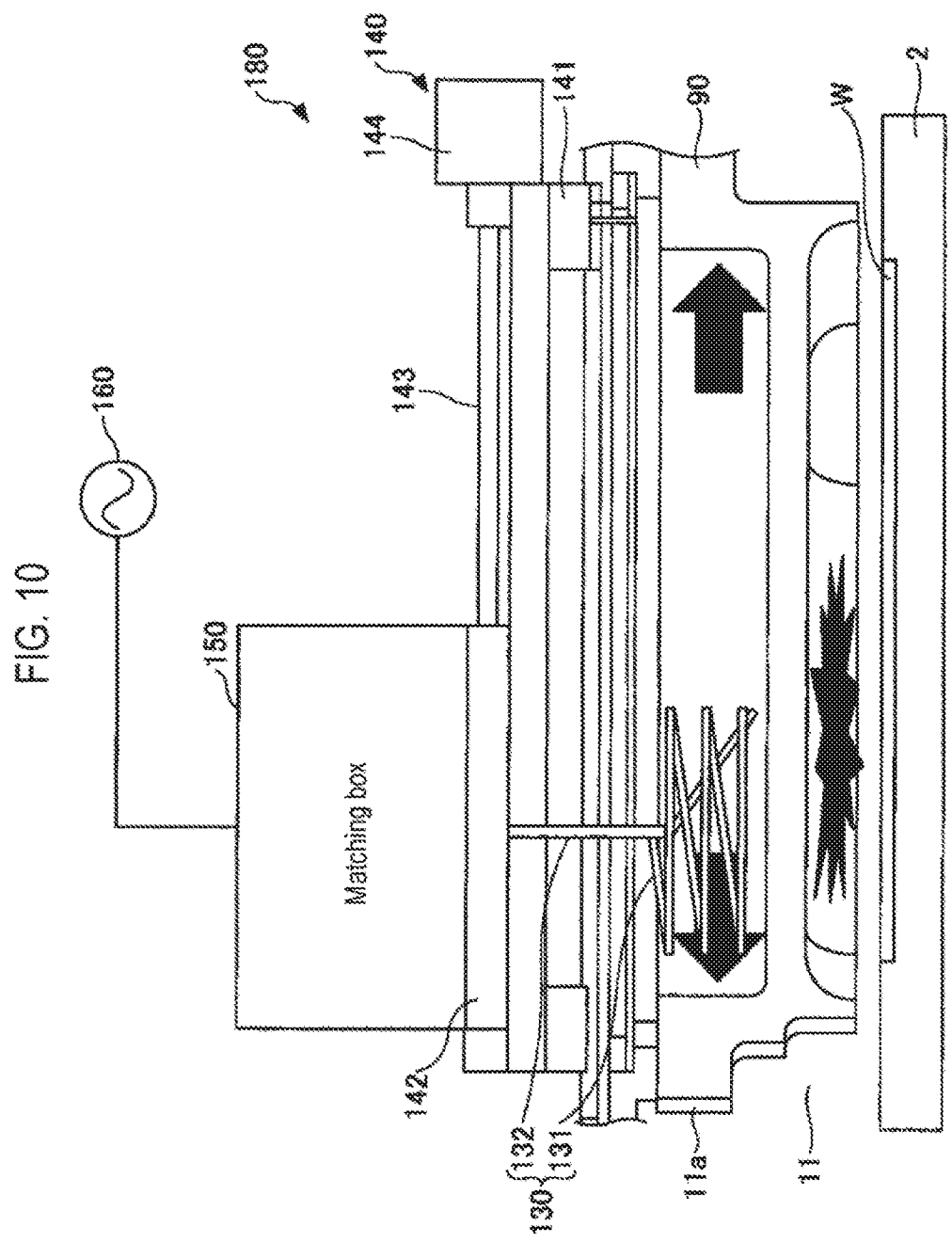
FIG. 10 is a view illustrating a state in which an antenna of the second plasma generator of the plasma processing apparatus, according to the first embodiment of the present disclosure, is moved to an inner circumferential side.

FIG. 10 is a view illustrating a state in which the antenna of the second plasma generator of the plasma processing apparatus according to the first embodiment of the present disclosure is moved to an inner circumferential side.

As illustrated in FIGS. 9 and 10, the plasma generator 180 including the moving mechanism 140 may drive a rotation of the motor 144 to move the antenna 131 in the radial direction of the rotation table 2. Accordingly, the plasma generator 180 can vary the moving speed of the antenna 131 by varying the rotational speed of the motor 144. In the case of the rotation table 2 capable of mounting a wafer W having a diameter of 300 mm, a moving distance in the circumferential direction of the outer circumferential portion of the rotation table 2 is about three times the moving distance in the circumferential direction of the inner circumferential portion (central portion) of the rotation table 2. In other words, a plasma application time in which plasma is applied to the wafer W (or the rotation table 2) by the plasma generator 80 fixed in one position in the circumferential direction of the rotation table 2 at the outer circumferential portion of the rotation table 2 is about a third of the time period at the inner circumferential portion. If the plasma application time is short, the plasma throughput is, of course, reduced. Accordingly, it is considered that the plasma throughput is made uniform by performing a control to equalize the plasma application time at the outer circumferential side and the plasma application time at the inner circumferential side of the rotation table 2.

For example, the plasma throughput can be made uniform by moving the antenna 131 at a lower speed on the outer circumferential side of the rotation table 2 and moving the antenna 131 at a higher speed on the inner circumferential side of the rotation table 2 to equalize the amounts of plasma applied to the inner and outer circumferential sides of the rotation table 2. For example, an imbalance in the plasma throughput is corrected by performing a control such that the moving speed of the antenna 131 when the antenna 131 is located on the outer circumferential side of the rotation table 2 is about one-third of that when the antenna 131 is located on the inner circumferential side of the rotation table 2. The moving speed may be varied step by step or continuously according to the position of the antenna 131. Furthermore, a stop time period during which the speed is zero, that is, the antenna 131 is at rest may be controlled.

For example, a time period to apply plasma at a circumferential speed in each position in the radial direction may be made uniform by regulating the position of the antenna 131 and the speed in each position such that the plasma application time at the outer circumferential side of the rotation table 2 is about three times the plasma application time at the inner circumferential side of the rotation table 2.

As described above, the small antenna 131 capable of locally applying plasma in the radial direction of the rotation table 2 and the wafer W can be moved in the radial direction to regulate the plasma application time, thereby uniformly processing the wafer W using plasma.

Since the antenna 131 horizontally moves and is not tilted in this case, potential is always maintained at a constant level so that the wafer W is not electrically damaged.

Further, the intensity of plasma generated by the antenna 131 can be varied by regulating the output (power) of the high-frequency power supply 160 and the matching device 150. As a result, an in-plane film quality can be regulated when the film is formed.

Accordingly, the plasma generator 180 may control the position of the antenna 131, the speed in each of the position, and the intensity of plasma and set parameters thereof appropriately to regulate a plasma throughput, thereby enabling a uniform plasma process.

The control including the setting of the parameters can be performed by the control part 120 illustrated in FIG. 1. In other words, the plasma processing apparatus according to this embodiment includes the control part 120 configured with a computer for controlling the overall operation of the apparatus. A program for performing substrate processing, which will be described below, is stored in a memory of the control part 120. The program includes a group of steps for executing various types of operations of the apparatus and is installed in the control part 120 from a memory part 121, which is a storage medium, such as a hard disc, a compact disc, a magneto-optical disc, a memory card, a flexible disc, etc.

The control part 120 can regulate the rotational speed (including the speed of zero) of the motor 144, which is a drive device, and can also regulate the output of the high-frequency power supply 160 in the same way. Accordingly, an optimal plasma process is performed by controlling the position of the antenna 131 in the second plasma generator 180, the speed in each of the position, and the intensity of plasma in order to achieve uniformity of the plasma process while considering a condition of a recipe or the like.

Further, the inventors have identified that, once plasma is generated, the plasma continues to be generated even though the antenna 131 is moved. Accordingly, if the antenna 131 is at rest only when the plasma is generated initially, it is quite possible to move the location where the plasma is applied by moving the antenna 131.

Next, other elements of the plasma processing apparatus according to this embodiment will be described.

A side ring 100, which is a cover body, is disposed on the outer circumferential side of the rotation table 2 so as to be located in a position slightly lower than the rotation table 2, as illustrated in FIG. 2. For example, two exhaust holes 61 and 62 are formed in the upper surface of the side ring 100 so as to be spaced apart from each other in the circumferential direction. In other words, two exhaust holes are formed in a bottom surface of the vacuum chamber 1, and the exhaust holes 61 and 62 are formed in the side ring 100 so as to correspond to two exhaust holes formed in a bottom surface of the vacuum chamber 1.

In this present disclosure, one of the exhaust holes 61 and 62 is referred to as the first exhaust hole 61, and the other is referred to as the second exhaust hole 62. Here, the first exhaust hole 61 is formed between the separation gas nozzle 42 and the first plasma generator 80 located on the downstream side with respect to the separation gas nozzle 42 in the rotational direction of the rotation table. Further, the second exhaust hole 62 is formed between the second plasma generator 180 and the separation region D located on the downstream side with respect to the plasma generator 180 in the rotational direction of the rotation table 2.

The first exhaust hole 61 is configured to exhaust the first process gas or the separation gas, and the second exhaust hole 62 is configured to exhaust the plasma process gas or the separation gas. Each of the first and second exhaust holes 61 and 62 is connected to, for example, a vacuum pump 64, which is a vacuum exhaust mechanism, through an exhaust pipe 63 where a pressure regulator 65 such as a butterfly valve is installed.

Since the housing 90 is disposed from the central region C side to the outer edge side as described above, a gas flowing from the upstream side with respect to the plasma process regions P2 and P3 in the rotational direction of the rotation table 2 may be restricted from being directed toward the exhaust hole 62 by the housing 90. Due to this, a gas passage 101 (see FIGS. 1 and 2) having a groove shape through which a gas flows is formed in the upper surface of the side ring 100 on the outer circumferential side of the housing 90.

As illustrated in FIG. 1, a protrusion 5 is formed on the central portion of the lower surface of the ceiling plate 11. The protrusion 5 is formed substantially in a ring shape in the circumferential direction in succession to a portion of the convex part 4 on the central region C side and has a lower surface at the same level with the lower surface (the ceiling surface 44) of the convex part 4. A labyrinth structure part 110 configured to restrict various types of gases from being mixed with each other in the central region C is disposed above the core part 21 which is closer to the rotation center of the rotation table 2 than the protrusion 5.

Since the housing 90 is formed to reach a position close to the central region C as described above, the core part 21 supporting the central portion of the rotation table 2 is formed on the rotation center side such that the upper portion of the rotation table 2 does not interfere with the housing 90. Due to this, various types of gases are more likely to be mixed with each other in the central region C than in the outer edge portion. Accordingly, the labyrinth structure part is formed above the core part 21 to provide a gas passage, thereby preventing gases from being mixed with each other.

More specifically, the labyrinth structure part 110 has a structure in which a wall part vertically extending toward the ceiling plate 11 from the rotation table 2 and a wall part vertically extending toward the rotation table 2 from the ceiling plate 11 are formed in the circumferential direction respectively and are alternately arranged in the radial direction of the rotation table 2. In the labyrinth structure part 110, for example, the first process gas discharged from the source gas nozzle 31 and directed toward the central region C needs to pass over the labyrinth structure part 110. Due to this, a flow velocity of the first process gas decreases toward the central region C so that the first process gas has difficulty in spreading. As a result, the process gas reverts to the process region P1 due to a separation gas supplied to the central region C before the process gas reaches the central region C. Likewise, other gases directed toward the central region C also have difficulty in reaching the central region C on account of the labyrinth structure part 110. Accordingly, the process gases are prevented from being mixed with each other in the central region C.

Meanwhile, the separation gas supplied from the separation gas supply pipe 51 to the central region C is likely to rapidly spread in the circumferential direction. However, since the labyrinth structure part 110 is provided, a flow velocity of the separation gas decreases while passing over the labyrinth structure part 110. In this case, a nitrogen gas is likely to infiltrate into, for example, a very narrow region between the rotation table 2 and the protrusion 92, but since a flow velocity of the nitrogen gas is reduced by the labyrinth structure part 110, the nitrogen gas flows to a relatively wide region, for example, a region in the vicinity of a conveyance port 15. Due to this, the nitrogen gas is restricted from flowing toward the lower side of the housing 90.

A heater unit 7, which is a heating device, is installed in a space between the rotation table 2 and the bottom surface portion 14 of the vacuum chamber 1, as illustrated in FIG. 1. The heater unit 7 is configured to heat a wafer W on the rotation table 2 to, for example, room temperature to about 760 degrees C. with the rotation table 2 therebetween. In FIG. 1, reference numeral 71a denotes a cover member provided on a side of the heater unit 7, and reference numeral 7a denotes a lid member configured to cover the upper side of the heater unit 7. A plurality of purge gas supply pipes 73 for purging the space below the heater unit 7 are provided on the bottom surface portion 14 of the vacuum chamber 1 in the circumferential direction.

The conveyance port 15 for delivering a wafer W is formed in the side wall of the vacuum chamber 1, as illustrated in FIG. 2. The conveyance port 15 is configured to be air-tightly opened or closed by a gate valve G. A conveyance arm (not shown) is provided outside the vacuum chamber 1, and the wafer W is conveyed into the vacuum chamber 1 using the conveyance arm.

With respect to the concave portion 24 of the rotation table 2, a delivery of the wafer W is performed by the conveyance arm (not shown) at a delivery position which faces the conveyance hole 15. Due to this, lifting pins and a lifting mechanism, which are not illustrated in the drawings, are installed in a position below the rotation table 2, which corresponds to the delivery position, such that the lifting pins pass through the concave portion 24 to lift the wafer W while supporting s back side of the wafer W.

Figure 11:
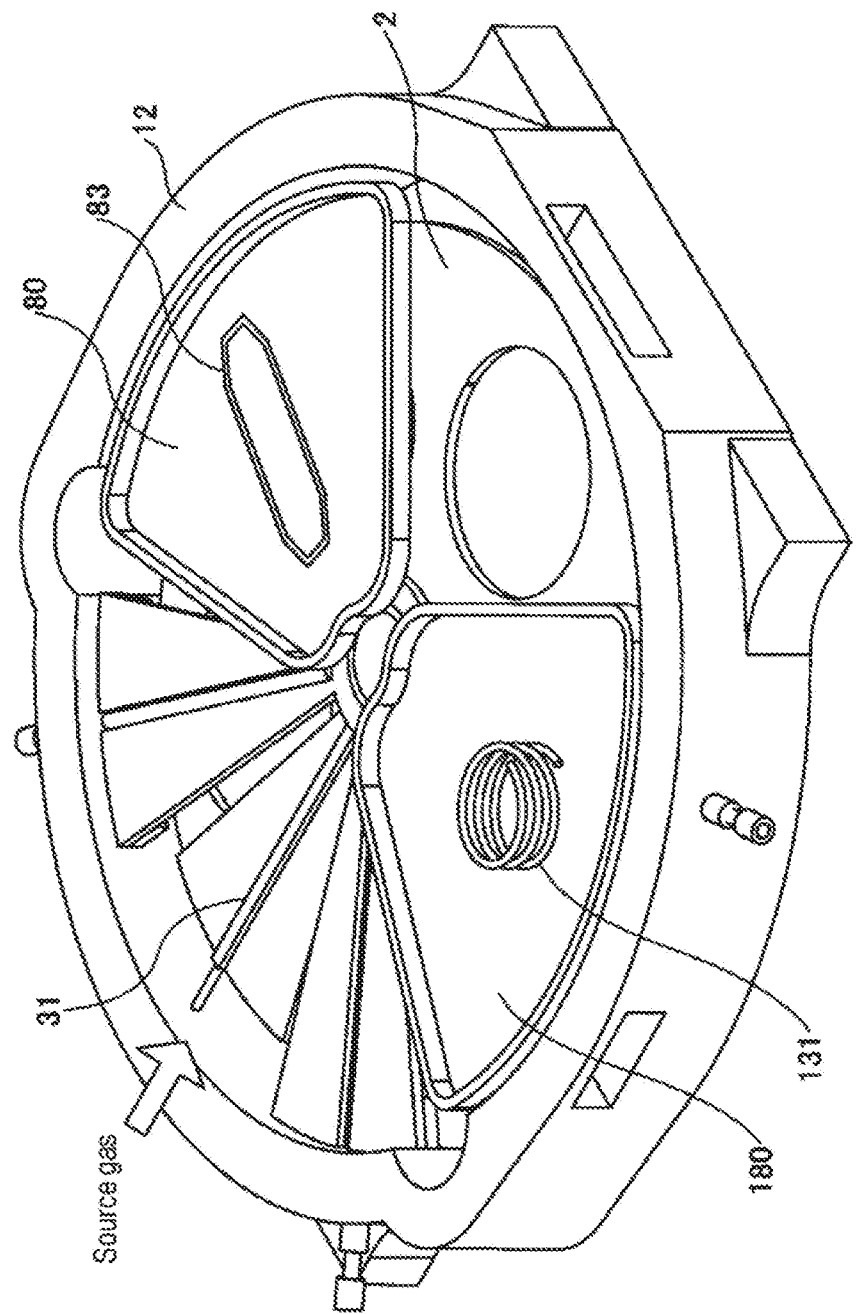
FIG. 11 is an exploded perspective view of the plasma generating apparatus according to the first embodiment of the present disclosure.

FIG. 11 is an exploded perspective view of the plasma generating apparatus according to the first embodiment of the present disclosure. As illustrated in FIG. 11, the first plasma generator 80 is configured to perform an oxidizing or nitrifying process, and the second plasma generator 180 is configured to adjust the oxidizing or nitrifying process to perform a modification.

Second Embodiment

Figure 12:
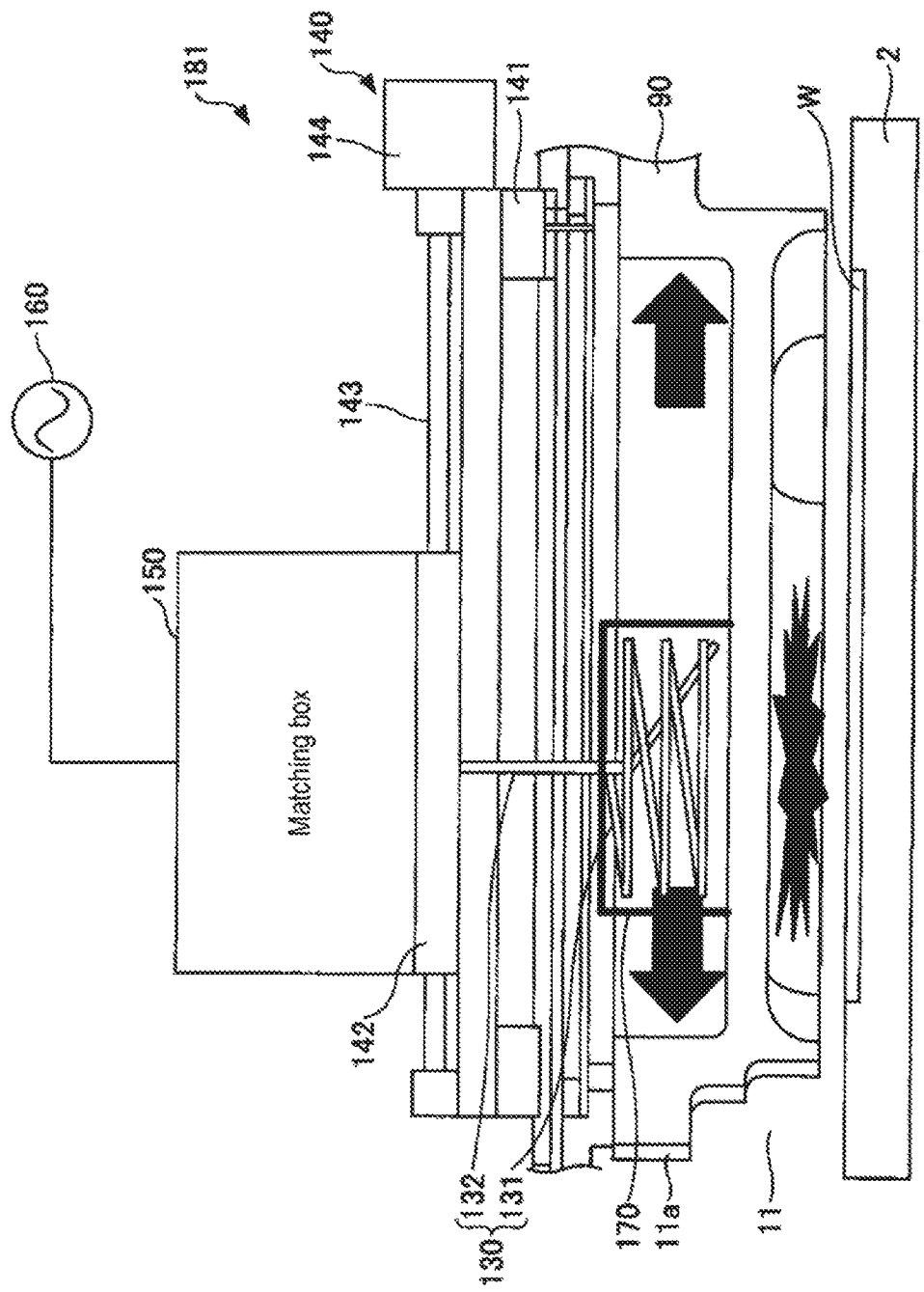
FIG. 12 is a view illustrating an example of a second plasma generator of a plasma processing apparatus according to a second embodiment of the present disclosure.

FIG. 12 illustrates an example of a second plasma generator of a plasma processing apparatus according to a second embodiment of the present disclosure. The second plasma generator 181 of the plasma processing apparatus according to the second embodiment differs from the second plasma generator 180 of the plasma processing apparatus according to the first embodiment in that a Faraday shield 170 surrounding an antenna 131 is newly installed. Since other elements are identical to those in the second plasma generator 180 of the plasma processing apparatus according to the first embodiment, the corresponding elements are provided with identical reference numerals, and descriptions thereof will be omitted.

As illustrated in FIG. 12, the Faraday shield 170 is installed to cover an area around the antenna 131 and is configured to move together with the antenna 131. Since the Faraday shield 170 is configured to move together with the antenna 131 as described above, a distance relationship and a location relationship between the antenna 131 and the Faraday shield 170 can be kept constant so that it is possible to maintain an intensity of plasma applied to a rotation table 2 (or a wafer W) at a constant level even though the antenna 131 moves. In other words, since the Faraday shield 170 is configured according to the shape of the antenna 131, there is a possibility that an electric filed cut amount, a magnetic field transmission amount and the like may vary when the antenna 131 moves. Accordingly, likewise to the matching device 150, the Faraday shield 170 is also preferably configured to move together with the antenna 131. Accordingly, it is possible to move plasma without a change in the intensity of the plasma and a change in the density of the plasma in the up and down direction even though the antenna 131 moves.

Figure 13A:
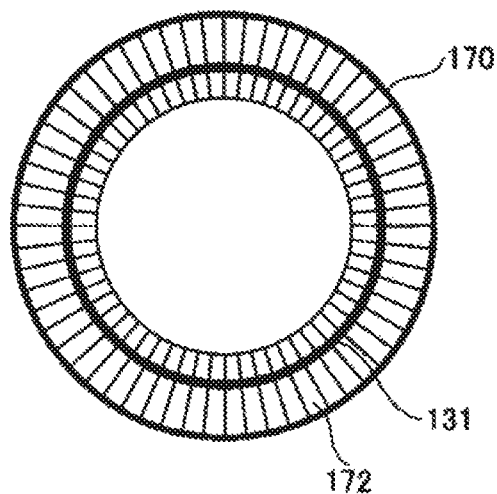
FIGS. 13A and 13B are views illustrating an antenna part and a Faraday shield in an example of the second plasma generator of the plasma processing apparatus according to the second embodiment of the present disclosure, where
Figure 13B:
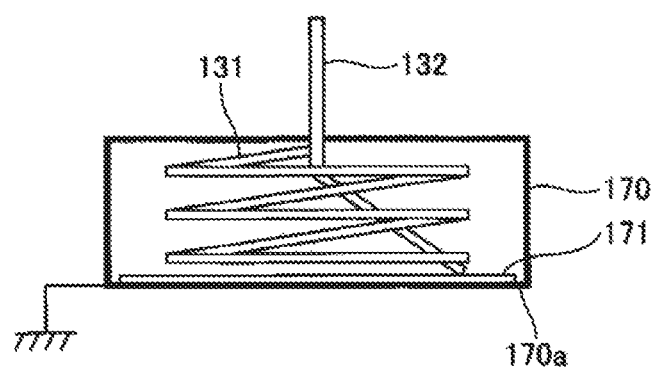

FIGS. 13A and 13B are views illustrating an antenna part and a Faraday shield in the example of the second plasma generator of the plasma processing apparatus according to the second embodiment of the present disclosure. FIG. 13A is a top view of an antenna part and a Faraday shield in the example of the second plasma generator, and FIG. 13B is a side view of the antenna part and the Faraday shield in an example of the second plasma generator.

As illustrated in FIGS. 13A and 13B, the Faraday shield 170 is formed substantially in a cylindrical shape and surrounds the antenna 131. As illustrated in FIG. 13B, an insulating plate 171 having a thickness of, for example, about 2 mm and formed of quartz is stacked on a bottom surface 170a of the Faraday shield 170 in order to ensure an insulation property between the Faraday shield 170 and the antenna 131 mounted thereon. Further, slits 172 are radially formed in the bottom surface 170a of the Faraday shield 170. Since both the antenna 131 and the Faraday shield 170 slide, a relationship between a position of the antenna 131 and the positions of the radial slits is always kept constant such that plasma can be uniformly applied in each region where the antenna 131 and the Faraday shield 170 move. Moreover, the Faraday shield 170 is grounded as illustrated in FIG. 13B.

Since the antenna 131 and the Faraday shield 170 horizontally move and are not tilted due to the movement as in the first embodiment, potential is maintained at a constant level so that a wafer W is not electrically damaged.

As described above, according to the plasma generator of the second embodiment, it is possible to maintain the intensity of plasma at a constant level even though the antenna 131 slides, thereby performing a desired plasma process as designed.

Third Embodiment

FIG. 14 is a view illustrating an example of a plasma processing apparatus according to a third embodiment of the present disclosure. In the plasma processing apparatus according to the third embodiment, a first plasma generator 280 as well as a second plasma generator 180 is configured to include a movable antenna 230. In other words, not only the second plasma generator 180 for modification but also the first plasma generator 280 for an oxidizing process or nitrifying process, is configured to perform a local plasma processing in the radial direction.

According to the above configuration, the first plasma generator 280 can also perform a plasma process uniformly on the inner and outer circumferential sides of the rotation table 2, thereby performing a plasma process with higher in-plane uniformity.

The first plasma generator 280 may adopt any configuration of the plasma generators 180 and 181 of the plasma generating apparatuses according to the first and second embodiments. Further, the configuration itself is the same as those of the second plasma generators 180 and 181 described in the first and second embodiments. Accordingly, a description thereof will be omitted. Furthermore, since other elements are also the same as those of the plasma generating apparatus according to the first embodiment, a description thereof will be omitted.

According to the plasma processing apparatus of the third embodiment, it is possible to perform a plasma process with enhanced in-plane uniformity.

Fourth Embodiment

FIG. 15 is a view illustrating an example of a plasma processing apparatus according to a fourth embodiment of the present disclosure. The plasma processing apparatus according to the fourth embodiment is configured by removing the first plasma generator 80 from the plasma processing apparatus according to the first embodiment and installing only the second plasma generator 180. The plasma processing apparatus according to the fourth embodiment differs from the plasma processing apparatus according to the first embodiment in terms of areas of the first process region P1 and the separation region D. In terms of elements, the plasma processing apparatus according to the fourth embodiment is configured by removing the first plasma generator 80 from the plasma processing apparatus according to the first embodiment. As described above, a modification process may be performed using only the plasma generator 180.

In this case, a first plasma process gas nozzle 32 is disposed, as it is, in a position where the first plasma generator 80 was installed, and only the first plasma generator 80 including the opening 11*a* and the housing 90, is removed. Further, the second plasma generator 180 including a second plasma process gas nozzle 33 is installed as it is.

Even in the above configuration, a reactant gas, such as an oxidizing gas or nitrifying gas, is supplied through the second plasma process gas nozzle 32 such that a reaction for generating a reaction product is carried out without using plasma and, thereafter, a modification process is performed by the plasma generator 180, whereby it is possible to perform a modification process while regulating the amount of applied plasma, enhancing in-plane uniformity of the substrate processing.

As described above, in accordance with the plasma processing apparatuses according to the embodiments of the present disclosure, the plasma generators 180, 181, and 280 including the movable antenna 131 can be installed in various manners according to their purposes so that it is possible to configure a plasma processing apparatus capable of regulating a plasma throughput in various forms.
<Film Forming Method>

Next, a plasma processing method using the plasma processing apparatuses according to an embodiment of the present disclosure, will be described. The plasma processing method, according to the embodiment of the present disclosure, can be carried out using the various plasma processing apparatuses equipped with the plasma generators 180, 181, and 280 using the movable antenna 131. Hereinafter, an example will be described in which a plasma processing is carried out using the plasma processing apparatus according to the first embodiment that includes one plasma generator 180 with a movable antenna and one plasma generator 80 with a stationary antenna.

Further, it will be exemplified that the plasma processing is applied to a method for forming a film by an Atomic Layer Deposition (ALD) method or a Molecular Layer Deposition (MLD) method. However, the plasma processing method, according to the embodiment of the present disclosure, is not limited to a film forming method and can be applied to various plasma processing methods, including annealing, etc., for performing a plasma process while rotating a rotation table on which substrates are arranged along the circumferential direction.

Prior to the execution of the plasma processing method, wafers W are carried in the vacuum chamber 1. Specifically, first, the gate valve G is opened. The wafers W are loaded on the rotation table 2 through a convenance port 15 by a convenance arm (not shown) while the rotation table 2 is intermittently being rotated.

Subsequently, the gate valve G is closed, and the wafers W are heated to a predetermined temperature by the heater unit 7. The temperature of the wafers W is set to a temperature in the range of, for example, 300 degrees C. to 800 degrees C. In succession, a source gas is discharged from the source gas nozzle 31 at a predetermined flow rate, and first and second plasma process gases are supplied from the first and second plasma process gas nozzles 32 and 33 at predetermined flow rates, respectively.

The pressure within the vacuum chamber 1 is adjusted to a predetermined pressure by the pressure regulator 65. A high-frequency power of a predetermined output is applied to the antennas 83 in the plasma generators 80 and 180. The high-frequency power may be set to, for example, 5 kW.

When one wafer W reaches the first process region P1 by the rotation of the rotation table 2, a source gas adsorption process is performed. In the source gas adsorption process, the source gas is supplied to the wafer W from the source gas nozzle 31 and is adsorbed onto the surface of the wafer W. The source gas may be, for example, a silicon-containing gas, etc.

In succession, the wafer W passes beneath the separation region D by the rotation of the rotation table 2, and the separation gas is supplied and purged. Thereafter, the wafer W reaches the second process region P2.

When the wafer W reaches the second process region P2, a reaction process is carried out. In the reaction process, a reactant gas is supplied from the first plasma process gas nozzle 32, a reaction product is generated by a reaction of the reactant gas with the source gas, and a molecular layer thereof is deposited on the surface of the wafer W. For example, the reactant gas is an oxidizing gas, such as ozone, oxygen, etc., or a nitrifying gas, such as ammonia, etc. In a case where the source gas is a silicon-containing gas, a silicon oxide film or a silicon nitride film is generated, and the molecular layer thereof is deposited on the surface of the wafer W. In this case, since the reactant gas is supplied while being activated by the first plasma generator 80, the oxidation or nitrification is performed effectively.

Subsequently, the wafer W reaches the third process region P3 by the rotation of the rotation table, and a modification process is carried out. In the modification process, the modification of the reaction product deposited on the surface of the wafer W is carried out by plasma processing. In this case, the modification process is carried out while the antenna 131 is in one position in the radial direction, since the plasma processing is performed by the second plasma generator 180. In the modification process, a modification process such as an oxidizing process or nitrifying process is performed by supplying a process gas similar to the first plasma process gas from the second plasma process gas nozzle 33. For an oxide film, an oxidizing gas is supplied while being brought into plasma, and for a nitride film, a nitrifying gas is supplied while being brought into plasma.

Since the antenna 131 is moving in the third process region P3, plasma is frequently applied to regions different from the previous region when the rotation table 2 continuously rotates a plurality of times. As described above, when the plasma is applied to the outer circumferential side of the rotation table 2, a control is basically performed to move the antenna at a lower speed than when plasma is applied to the inner circumferential side of the rotation table 2.

The control part 120 controls the rotational speed of the motor 144 and the output of the high-frequency power supply 160 to make the position and moving speed of the antenna 131 and the intensity of plasma uniform in the radial direction throughout the entire plasma processing.

Subsequently, the wafer W passes beneath the separation region D by the rotation of the rotation table 2, and the separation gas is supplied and purged. $N_2$, Ar, etc. is used as the separation gas (purge gas). The wafer W reaches the first process region P1 after passing the separation region D. Then, the source gas adsorption process is carried out again.

A film is formed on the wafer W by the plasma processing by repeating the source adsorption process, the reaction process, and the modification process along with the rotation of the rotation table 2. In this case, as described above, the antenna 131 in the plasma generator 180 slides so that the modification process is uniformly performed over the entirety by plasma. When the thickness of the film reaches a predetermined film thickness, the film forming process is terminated. Accordingly, the plasma processing method, according to the embodiment of the present disclosure, ends.

As described above, the antenna 131 in the plasma generator 180 is preferably moved at a lower speed when the antenna 131 is located on the outer circumferential side of the rotation table 2 and at a higher speed when the antenna 131 is located on the inner circumferential side of the rotation table 2 in order to equalize the amounts of plasma applied to the inner and outer circumferential sides of the rotation table 2. Accordingly, the plasma throughput can be made uniform. For example, an imbalance in the plasma throughput is corrected by performing a control such that the moving speed of the antenna 131 when the antenna 131 is located on the outer circumferential side of the rotation table 2 is about one-third of that when the antenna 131 is located on the inner circumferential side of the rotation table 2. The moving speed may be varied step by step or continuously according to the position of the antenna 131. Furthermore, the plasma generator 180 may perform a control including a stop time period during which the speed of the antenna 131 is zero, that is, the antenna 131 is at rest.

In other words, for example, a time period to apply plasma at a circumferential speed in each position in the radial direction can be made uniform, for example, by regulating the position of the antenna 131 and the speed in each of the position such that the time period during which the plasma is applied to the outer circumferential side of the rotation table 2 is about three times the time period during which the plasma is applied to the inner circumferential side of the rotation table 2.

Further, the intensity of plasma generated by the antenna 131 can be varied by regulating the output (power) of the high-frequency power supply 160 and the matching device 150. As a result, an in-plane film quality can be regulated when the film is formed.

As described above, the plasma generator 180 can control the position of the antenna 131, the speed in each of the position, and the intensity of plasma and can perform uniform plasma processing by regulating a plasma throughput by appropriately setting these parameters.

When the plasma processing (the film forming process) ends, the supply of the gases from the gas nozzles 31 to 33, 41, and 42 are stopped, and the rotation table 2 also stops. Thereafter, the gate valve G is opened, and the wafer W after the film forming (plasma) is performed is unloaded through the conveyance port 15 using the conveyance arm (not shown). When the unloading of all the wafers W is completed, the entire film forming (plasma) process is completed. According to necessity, wafers W to be processed are carried in the vacuum chamber 1, and a film forming (plasma) process is performed in the same way.

According to the plasma processing method according to the embodiment of the present disclosure, it is possible to make the plasma throughput of a wafer W uniform irrespective of the distance from the center of the rotation table 2 by locally correcting and regulating the plasma throughput in the radial direction of the rotation table 2.

According to the present disclosure, it is possible to locally regulate a plasma throughput.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
   a processing chamber;
   a rotation table installed in the processing chamber and configured to load a substrate on an upper surface of the rotation table along a circumferential direction of the rotation table; and
   a first plasma generator including a first antenna located above an upper surface of the processing chamber and installed to move in a radial direction of the rotation table, wherein the first plasma generator is configured to locally apply plasma to the rotation table in the radial direction,
   wherein a slide mechanism configured to move the first antenna along the radial direction is installed on the upper surface of the processing chamber and slides the first antenna, the slide mechanism comprising:
   a slider configured to support the first antenna; and
   a guide part extending along the moving direction of the slide mechanism and configured to support the slider such that the slider slide along the moving direction; and
   a drive part configured to drive the slider or the guide part and to slide the slider to a predetermined position.

2. The plasma processing apparatus of claim 1, wherein a length of the first antenna is less than or equal to a half of a radius of the rotation table in the radial direction.

3. The plasma processing apparatus of claim 1, wherein the first antenna is configured to move along the radial direction.

4. The plasma processing apparatus of claim 1, wherein the guide part is a ball screw, and the drive part is a motor.

5. The plasma processing apparatus of claim 1, wherein the first antenna is installed in a concave region formed on the upper surface of the processing chamber and is supported while being suspended from the slider.

6. The plasma processing apparatus of claim 1, wherein a matching device is integrally installed with the slider, and the first antenna is configured to slide together with the matching device.

7. The plasma processing apparatus of claim 1, wherein the first antenna is surrounded by a Faraday shield and the Faraday shield is secured to the slider; and wherein the first antenna is configured to slide together with the Faraday shield.

8. The plasma processing apparatus of claim 1, wherein the drive part is configured to vary a moving speed of the slider.

9. The plasma processing apparatus of claim 8, further comprising:

a control part configured to control the position of the slider driven by the drive part and the moving speed of the slider in the corresponding position.

10. The plasma processing apparatus of claim 9, wherein the control part controls the moving speed of the slider such that a first moving speed at which the slider is in a first position of the rotation table is less than or equal to a second moving speed at which the slider is in a second position on an inner circumferential side than the first position of the rotation table.

11. The plasma processing apparatus of claim 9, wherein the control part is configured to control an output of the first plasma generator.

12. The plasma processing apparatus of claim 1, wherein the rotation table is further configured to load a plurality of the substrates on the upper surface of the rotation table along the circumferential direction, the apparatus further comprising:

a first process gas supply part installed above the rotation table within the processing chamber, the first process gas supply part being spaced apart from the first plasma generator in the circumferential direction of the rotation table to supply a first process gas to the rotation table;

a second process gas supply part disposed between the first process gas supply part and the first plasma generator in the circumferential direction of the rotation table to supply the rotation table with a second process gas which reacts with first process gas to generate a reaction product, and wherein the first plasma generator is further configured to perform a modification process on the reaction product by applying the plasma to the reaction product.

13. The plasma processing apparatus of claim 12, further comprising a second plasma generator installed on the upper surface of the processing chamber and above the second process gas supply part.

14. The plasma processing apparatus of claim 13, wherein the second plasma generator includes a second antenna secured to the upper surface of the processing chamber such that the second antenna covers substantially an entire radius of the rotation table in the radial direction.

15. The plasma processing apparatus of claim 13, wherein the second plasma generator includes a second antenna installed above the upper surface of the processing chamber such that the second antenna move in the radial direction and is configured to locally apply plasma to the rotation table in the radial direction.

16. A plasma processing method comprising:

rotating a rotation table installed in a processing chamber and having at least one substrate loaded on the rotation table along a circumferential direction of the rotation table; and generating plasma while moving an antenna installed above an upper surface of the processing chamber in a radial direction of the rotation table, and locally applying the plasma to the substrate in the radial direction of the rotation table, wherein the antenna is moved such that a first moving speed when the antenna is in a first position of the rotation table is less than or equal to a second moving speed when the antenna is in a second position on an inner circumferential side than the first position of the rotation table.

17. A plasma processing method comprising:

rotating a rotation table installed in a processing chamber and having at least one substrate loaded on the rotation table along a circumferential direction of the rotation table; and generating plasma while moving an antenna installed above an upper surface of the processing chamber in a radial direction of the rotation table, and locally applying the plasma to the substrate in the radial direction of the rotation table, wherein a difference in a moving speed in the circumferential direction based on a difference in a distance from a center of the rotation table in the radial direction is compensated, and when a position of the antenna and the moving speed in the corresponding position are controlled such that a time period during which the plasma is applied is constant in all positions in the radial direction.

* * * * *